(12) United States Patent
Stuckey et al.

(10) Patent No.: US 11,474,147 B2
(45) Date of Patent: Oct. 18, 2022

(54) KIT-LESS PICK AND PLACE HANDLER SYSTEM FOR THERMAL TESTING

(71) Applicant: Boston Semi Equipment LLC, Billerica, MA (US)

(72) Inventors: Larry Stuckey, Billerica, MA (US); Igor Shekhtman, Billerica, MA (US); John Lewis, Billerica, MA (US); Kent Blumenshine, Billerica, MA (US); Colin Scholefield, Billerica, MA (US)

(73) Assignee: Boston Semi Equipment LLC, Billerica, MA (US)

( * ) Notice: Subject to any disclaimer, the term of this patent is extended or adjusted under 35 U.S.C. 154(b) by 0 days.

(21) Appl. No.: 16/955,583

(22) PCT Filed: Dec. 19, 2018

(86) PCT No.: PCT/US2018/066582
§ 371 (c)(1),
(2) Date: Jun. 18, 2020

(87) PCT Pub. No.: WO2019/126375
PCT Pub. Date: Jun. 27, 2019

(65) Prior Publication Data
US 2020/0341054 A1    Oct. 29, 2020

Related U.S. Application Data

(60) Provisional application No. 62/607,748, filed on Dec. 19, 2017.

(51) Int. Cl.
*G01R 31/28* (2006.01)

(52) U.S. Cl.
CPC ..... *G01R 31/2868* (2013.01); *G01R 31/2867* (2013.01); *G01R 31/2874* (2013.01); *G01R 31/2893* (2013.01)

(58) Field of Classification Search
CPC ............ G01R 31/2893; G01R 31/2867; G01R 31/2868; G01R 31/2874; G01R 31/31905;
(Continued)

(56) References Cited

U.S. PATENT DOCUMENTS

| 5,905,472 A | * | 5/1999 | Wolfson | ................. | H01Q 13/20 |
| | | | | | 343/762 |
| 6,104,183 A | * | 8/2000 | Kobayashi | ......... | G01R 31/2868 |
| | | | | | 324/757.04 |

(Continued)

FOREIGN PATENT DOCUMENTS

| CN | 201246580 Y | 5/2009 |
| CN | 103841814 A | 6/2014 |

(Continued)

OTHER PUBLICATIONS

International Search Report and Written Opinion in International Application No. PCT/US2018/066582, dated Mar. 22, 2019 (16 pages).

(Continued)

*Primary Examiner* — Vinh P Nguyen
(74) *Attorney, Agent, or Firm* — Nixon Peabody LLP

(57) ABSTRACT

The present disclosure provides for a kit-less pick and place handler which conducts thermal testing of at least one device. An exemplary handler includes a thermal soak plate, a first prime mover, a second prime mover, a test site actuator, and a test contactor. The thermal soak plate can receive devices and maintain an accurate position of the devices using a friction between the thermal soak plate and the device. The test contactor can electrically contact the device. The first prime mover can place the device on the thermal soak plate. The second prime mover can carry the device to the test contactor, hold the device during thermal testing, and move the device from the test contactor. The test (Continued)

site actuator can exert force on the second prime mover during thermal testing.

18 Claims, 20 Drawing Sheets

(58) Field of Classification Search
CPC ............... G01R 31/26; G01R 31/2851; G01R 31/2886; G01R 31/311; B65G 47/90; B65G 61/00; B65G 47/905; B65G 47/91; B65G 47/914; B65G 1/045; B65G 1/0478; B65G 1/127; B65G 2201/0258; B65G 2203/041; B65G 2207/46; B65G 47/5104; B65G 65/00; B65G 65/365; B65G 65/425; B65G 59/067; B65G 1/1376; B65G 2203/042; B25J 15/0052; B25J 9/0084; B25J 11/00; B25J 15/0616; B25J 5/02; B25J 9/026; B25J 9/042; B25J 9/109; B25J 9/0093; B25J 9/0078; B25J 9/1065; B25J 9/1615; B25J 9/1697; G05B 2219/31316

See application file for complete search history.

(56) References Cited

U.S. PATENT DOCUMENTS

| | | | | |
|---|---|---|---|---|
| 6,459,259 B1* | 10/2002 | Ito | .......................... | G01R 31/01 324/757.01 |
| 6,626,132 B1* | 9/2003 | Mann | ................... | A01K 27/003 119/769 |
| 6,831,454 B2* | 12/2004 | Bae | .................... | G01R 31/2893 324/756.02 |
| 8,037,996 B2* | 10/2011 | Cheng | .................... | B65G 47/91 198/468.4 |
| 8,870,244 B2* | 10/2014 | Liang | ...................... | E05B 63/20 292/173 |
| 8,941,729 B2* | 1/2015 | Kikuchi | ............. | G01R 31/2893 348/126 |
| 10,436,834 B2* | 10/2019 | Wiesbock | .......... | G01R 31/2868 |
| 2003/0030430 A1 | 2/2003 | Pfahnl | | |
| 2003/0047305 A1 | 3/2003 | Malinoski | | |
| 2005/0180844 A1 | 8/2005 | Uekhert | | |
| 2006/0154386 A1 | 7/2006 | Cheng | | |
| 2006/0290369 A1 | 12/2006 | Yamashita | | |
| 2007/0024313 A1 | 2/2007 | Itakura | | |
| 2009/0314607 A1* | 12/2009 | Karino | ............... | G01R 31/2893 198/341.01 |
| 2011/0074458 A1 | 3/2011 | Di Stefano | | |
| 2011/0254945 A1 | 10/2011 | Kikuchi | | |
| 2016/0306008 A1* | 10/2016 | Wiesbock | .......... | G01R 31/2868 |

FOREIGN PATENT DOCUMENTS

| | | | | |
|---|---|---|---|---|
| CN | 205944056 U | | 2/2017 | |
| KR | 2002005276 | * | 1/2002 | ............. H01L 21/66 |
| TW | 201722821 A | | 7/2017 | |
| WO | WO 2009/096896 A1 | | 8/2009 | |
| WO | WO 2017/122048 A1 | | 7/2017 | |

OTHER PUBLICATIONS

Extended European Search Report in European Patent Application No. EP 18891133.3, dated Nov. 24, 2021 (9 pages).

* cited by examiner

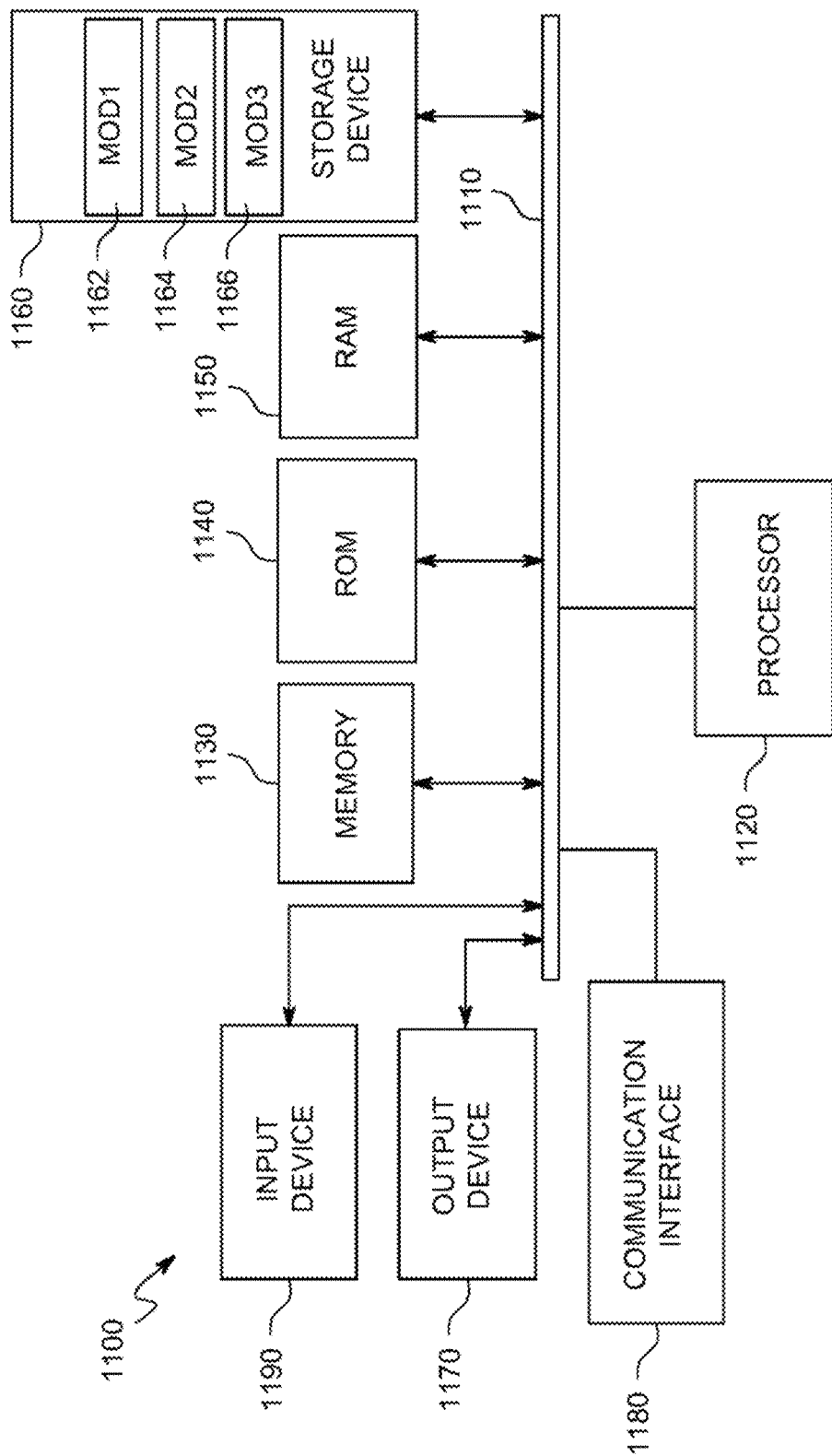

KIT-LESS PICK AND PLACE HANDLER SYSTEM FOR THERMAL TESTING

CROSS REFERENCE TO RELATED APPLICATIONS

This application is a U.S. National Stage Entry of International Application No. PCT/US2018/066582, filed Dec. 19, 2018, entitled "KIT-LESS PICK AND PLACE HANDLER," which claims priority under 35 U.S.C. § 119 to U.S. Provisional Application No. 62/607,748, entitled "TURRET BASED PICK AND PLACE HANDLER," and filed on Dec. 19, 2017. The contents of each of which are hereby incorporated by reference in their entirety.

FIELD

The present disclosure relates to a kit-less pick and place handler.

BACKGROUND

Integrated Circuits (ICs) require quality and performance verification prior to shipment from the manufacturer. ICs are required to perform in extreme temperature environments and must be tested under those conditions in order to verify proper functionality. A test handler's purpose is to present thermally conditioned ICs at the proper test temperature to a contactor, which is capable of electrically connecting the IC to a tester. The IC handler receives binning information from the tester and uses this information to properly sort the ICs into the proper binning/category after test.

The IC test handler is required to move ICs to and from transportation media (i.e. joint electron device engineering council (JEDEC) trays). JEDEC trays have common external dimensions and contain pockets for ICs for which the quantity, matrix and X, Y spacing (pitch) vary according to the IC size.

Prior to testing, the ICs must be placed correctly so that the electrical contact points of each IC touch the contacting surface. Typically, this requires individual alignment of the IC with respect to the X, Y, and theta position of the contactor's electrical contact points. This operation of picking up the IC from the tray and placing it down is referred to as PnP, or Pick and Place. To facilitate PnP operations, conventional IC test handlers typically rely on trays and soak plates with pockets, slots, or other pre-defined positions for the ICs. However, the use of such trays and thermal soak plates is not only costly (as custom thermal soak plates and mechanical alignment plates are required for each type of IC), but also still requires many mechanical alignment operations to be performed.

At the same time, throughput (units processed per hour (UPH)) requirements for conventional IC test handlers are constantly increasing. However, attempts to increase the UPH are generally limited by the time required to thermally condition ICs to the proper temperature, the time required to place each IC individually for a corrected X, Y, theta position, and the time required after each PnP operation to correct any accuracy issues.

SUMMARY

The various examples of the present disclosure are directed towards a test handler system for conducting thermal testing of at least one device. The test handler system can include a kit-less device handling system, a first prime mover, a second prime mover, a test contactor, and a test site actuator. The kit-less device handling system can include a thermal soak plate configured to receive the device and to maintain an accurate position of the device. The test contactor can electrically contact the device. The first prime mover can place the device on the thermal soak plate. The second prime mover can carry the device to the test contactor, hold the device during thermal testing, and move the device from the test contactor. The test site actuator can exert force on the second prime mover during thermal testing. In some examples, the device can be an integrated circuit. In some examples, test handler system can conduct thermal testing for a plurality of devices.

In some examples, there can be more than one second prime mover.

In some examples, the first prime mover can include a gantry and an XYZ head. The XYZ head can include one or more pick and place heads. Each of the pick and place heads can include a vacuum tip under a constant or variable (intermittent) vacuum for picking up the device. Each of the pick and place heads can also include a removing element for separating the vacuum tip from the device to place the device. The removing element can be a stripper assay or an ejector. In some examples, each of the one or more pick and place heads can be connected to the same vacuum source. In other examples, each of the one or more pick and place heads can be connected to different vacuum sources.

In some examples, the XYZ head can rotate the device before and/or after testing in a unitary pick and place motion. The XYZ head can also make a theta correction to the device before and after testing. In some examples, the theta correction can occur during the pick and place movement.

In some examples, the gantry and the test handler head can transfer the device between a thermal soak plate and a JEDEC tray. In some examples, a tray frame can hold the JEDEC tray and bias the JEDEC tray to an unwarped configuration.

In some examples, the thermal soak plate can include a surface for maintaining a position of the device without mechanical structures. For example, the thermal soak plate can include a tacky surface for maintaining a position of the device based on a friction between the device and the thermal soak plate.

In some examples, the test handler system can visually verify the location of the device through the use of a camera. The camera can be used prior to placement of the device on the soak plate.

In some examples, the test handler system can further include a plurality of tray separators, where each tray separator is associated with a bin. The test handler system can separate each device into a bin and transport the binned device into a corresponding tray separator.

In some examples, the plurality of tray separators can separate a plurality of trays. Separating the plurality of trays can occur based on whether each tray holds tested devices, untested devices, or no devices.

In some examples, the present disclosure can provide for a heat transfer system for the thermal soak plate. The heat transfer system can use pressurized helium as a heat transfer medium to heat and cool the devices. In some examples, the heat transfer system can use pressurized gas or liquid as a heat transfer medium to heat and cool the devices.

In some examples, the test handler system can learn a location of pick and place points in the test handler system based on at least one of fiducials or image recognition. Pick and place points can include locations where the first and second prime movers pick up and place the device (or the plurality of devices).

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 11 is a schematic block diagram illustrating an exemplary computer system, in accordance with an implementation of the present disclosure.

DETAILED DESCRIPTION

Figure 1A:
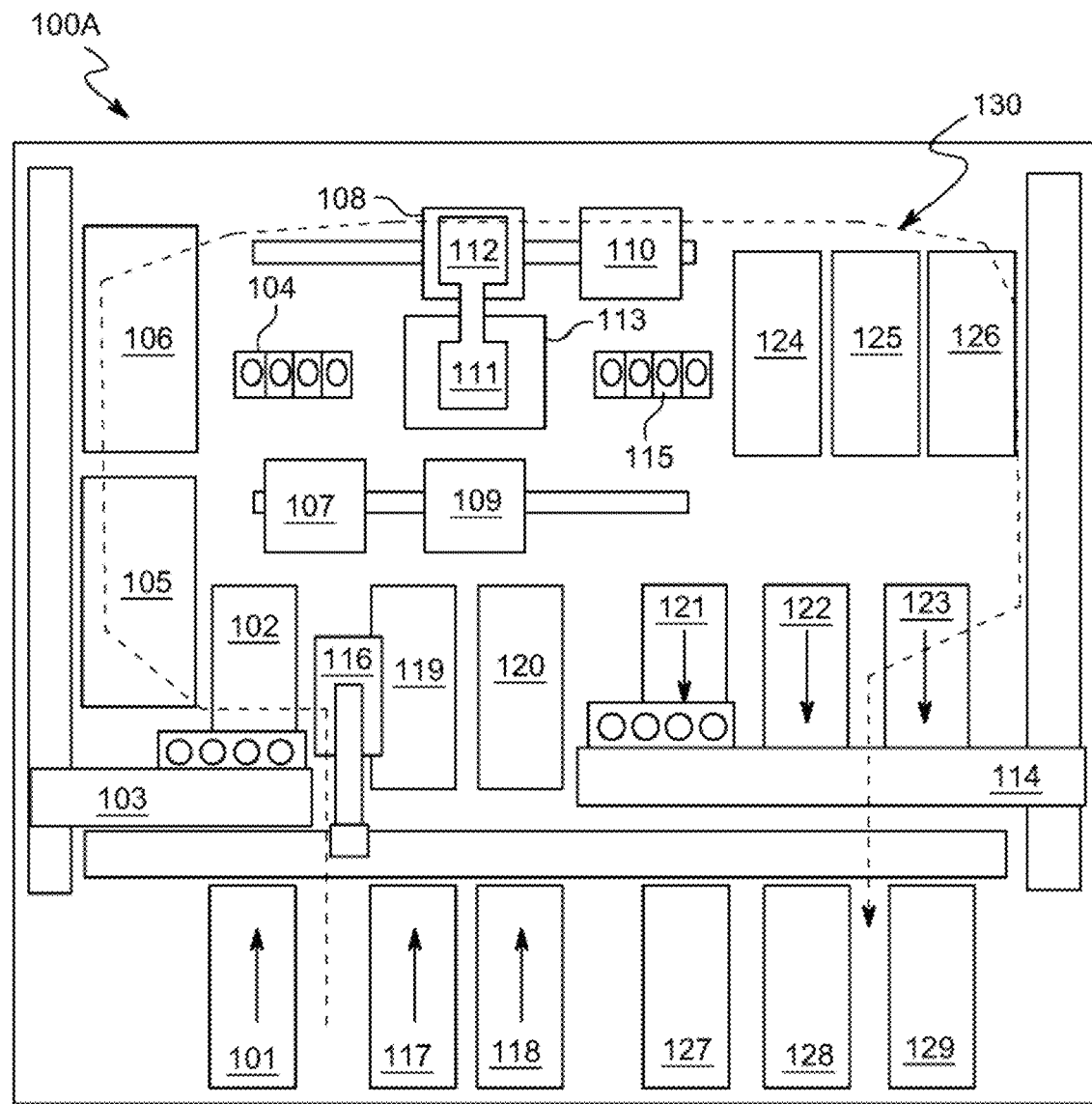
FIG. 1A shows an exemplary layout of a conventional test handler system, according to the prior art.

The present invention is described with reference to the attached figures, where like reference numerals are used throughout the figures to designate similar or equivalent elements. The figures are not drawn to scale, and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure provides for a kit-less pick and place handler which can conduct thermal testing of a plurality of devices. An exemplary handler can include a thermal soak plate, a first prime mover, a second prime mover, a test site actuator, and a test site. The thermal soak plate can receive devices and maintain an accurate position of the devices due to a friction between the thermal soak plate and the devices. Therefore, no mechanical separation is needed between the devices, allowing devices of different sizes to be tested on the same thermal soak plate or even at the same time. The first prime mover can place the devices on the thermal soak plate. The second prime mover can move the devices to and from the thermal test site, where the devices can be thermally tested.

Therefore, the present disclosure provides a kit-less pick and place handler which maintains a position and orientation of the devices during testing with a higher accuracy and while requiring fewer device corrections than conventional designs. Such a design minimizes movement of the devices during thermal testing so that devices are handled by the system in only three instances, while conventional handlers require far more frequent touching and moving of the devices. Additional features and embodiments of an exemplary kit-less pick and place handler are discussed herein.

Figure 1B:
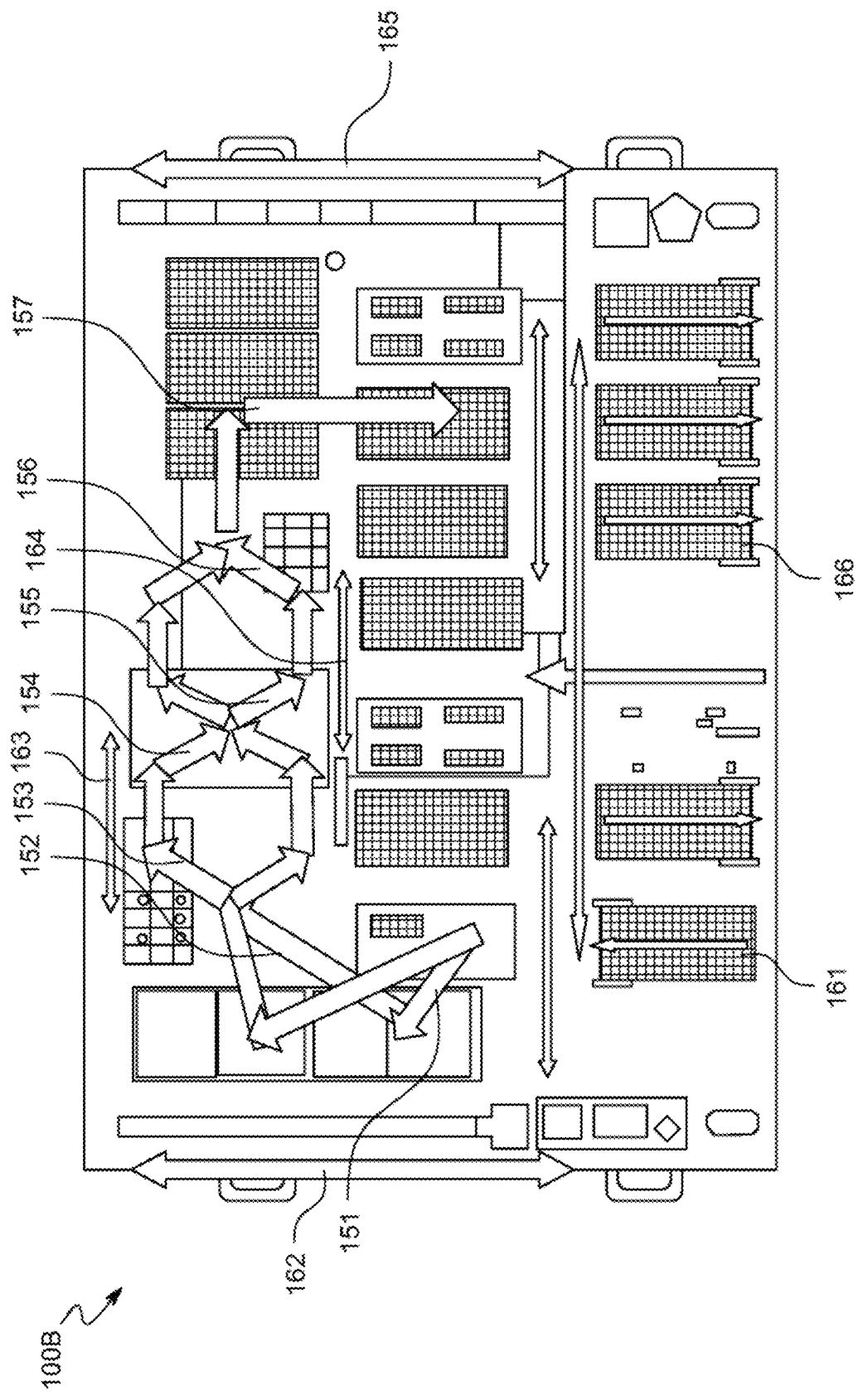
FIG. 1B shows a schematic diagram of an exemplary movement path through a conventional test handler system, according to the prior art.
Figure 2:
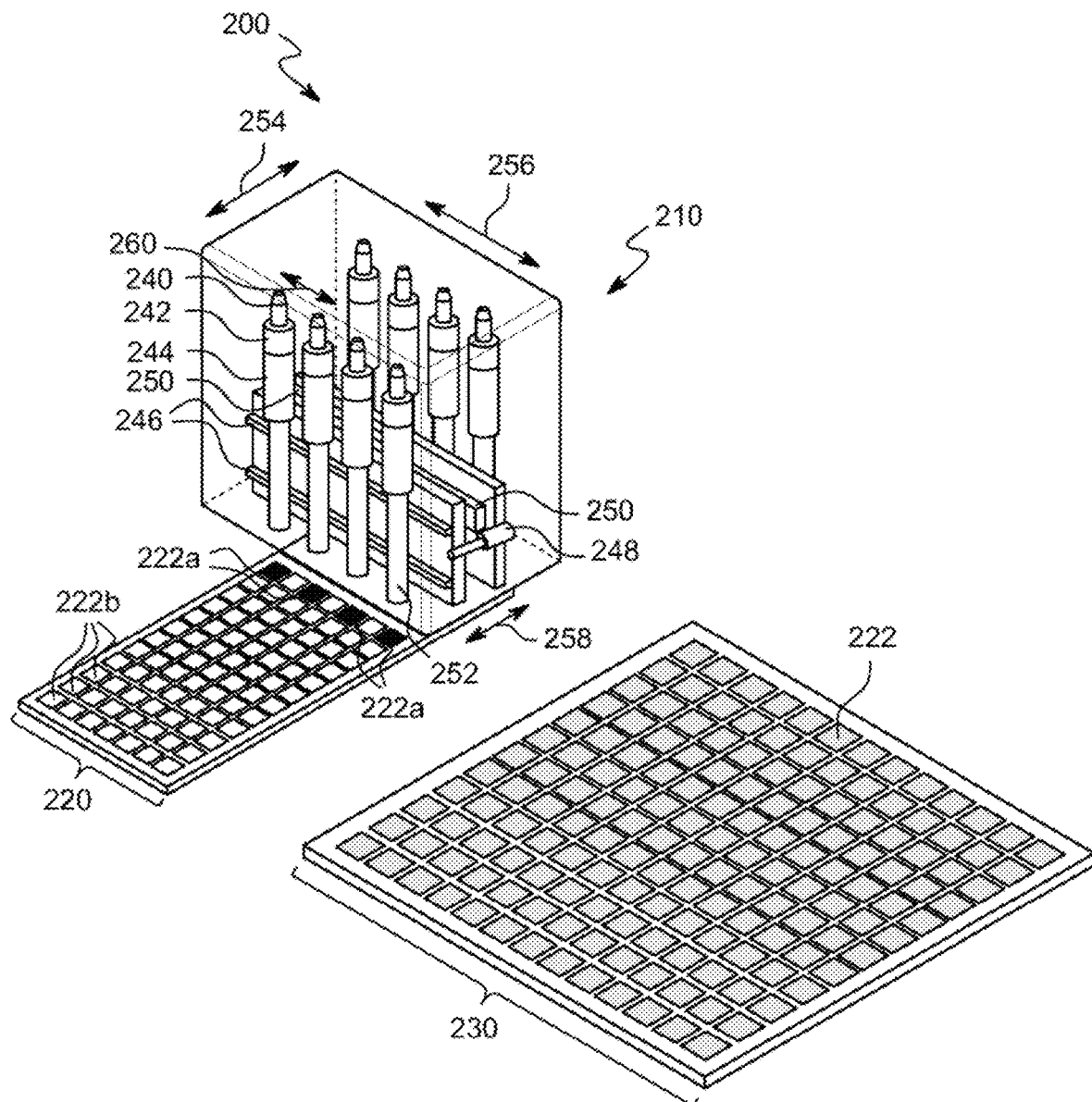
FIG. 2 shows a conventional test handler head and thermal soak plate, according to the prior art.

FIGS. 1A, 1B, and 2 show the conventional layouts and components of exemplary conventional test handlers. For example, FIG. 1A shows a system 100A of a conventional test handler layout. System 100 can include a load stacker 101, an load tray 102, an load transfer 103, an IC rotator load (operation) 104, a first preheat 105, a second preheat (operation) 106, a shuttle F load 107, a shuttle B load 108, shuttle F unload 109, shuttle B unload 110, a contactor F 111, a contactor B 112, a socket area 113, an unload transfer 114, an IC rotator unload (operation) 115, a tray transfer 116, a first tray buffer stacker 117, a second tray buffer stacker (operation) 118, a TB1 Tray 119, a TB2 Tray (operation) 120, a first unload tray 121, a second unload tray 122, a third unload tray 123, a fourth unload tray (single tray) 124, a fifth unload tray (single tray) 125, a sixth unload tray (single tray) 126, a first unload stacker 127, a second unload stacker 128, and a third unload stacker 129. Devices must follow the dotted path 130 to complete thermal testing according to system 100A.

FIG. 1B shows another conventional test handler system 100B. System 100B can include device movements 151, 152, 153, 154, 155, 156, and 157 and mechanism movements 161, 162, 163, 164, 165, and 166. System 100B therefore provides for moving devices from an input tray to a soak plate in movement 151; from a soak plate to a test site and then to a rotator in movement 152; from the rotator to load an upper shuttle in movement 153; from the loaded upper shuttle to a test site in movement 154; from the test site to load a lower shuttle in movement 155; from the loaded lower shuttle to a rotator in movement 156; and from the rotator to the sort tray in movement 157.

System 100B provides for all of the device movements 151, 152, 153, 154, 155, 156, and 157 by a series of mechanism movements 161, 162, 163, 164, 165, and 166. For example, system 100B loads the trays at movement 161; operates the right side X/Y mover track and the soak plate test site shuttles at movement 162; operates the test site upper shuttle at 163; operates the test site lower shuttle at 164; operates the left side X/Y mover track and the soak plate test site shuttles at movement 165; and unloads the trays at movement 166.

Therefore, FIGS. 1A-1B demonstrate the continuous movements that devices undergo when interacting with the variety of components in system 100. Such a conventional system exposes devices to many movements, stops, and touches (i.e. when the devices are physically touched by the system 100) as the devices make their way through the testing process. Devices must be moved through many stations to ensure they are loaded, have been soaked at a desired temperature, are tested, are cooled or de-soaked, and are unloaded.

Each movement and touch can change a position or orientation of the device, and in some cases, dislodge the devices altogether (discussed further with respect to FIG. 2) or damage the devices. Incorrect position or orientation of a single device can cause testing of the entire system (such as system 100A or system 100B) to cease while the device is repositioned. Further, when repositioning, there is an opportunity for the devices' temperature to vary from the soak temperature. Varying soak temperature leads to inaccurate testing of the devices. In situations where the device cannot be repositioned, the device might not be properly tested.

FIG. 2 shows a conventional test handler head 210, a conventional JEDEC tray 220, and a conventional thermal soak plate 230. The test handler head 210 can include a vacuum mechanism 240, a theta motor 242, a z-motor 244, x-pitch bearings 246, a y-pitch motor 248, an x-pitch motor 250, a z-bearing 252, a y-axis 254, an x-axis 256, and an x-pitch 260. The JEDEC tray 220 further shows pockets 222 in a filled position 222b and an unfilled position 222a.

In general, devices are placed in the JEDEC tray 220 with a known pin one location. The devices are then transferred to the thermal soak plate 230 by the test handler head 210. In some cases, the pitch between the thermal soak plate 230 and the JEDEC 220 tray can vary. As a result, X/Y movements (for example by the x-pitch motor 250 or the y-pitch motor 248) are required to position the devices correctly in the thermal soak plate 230. Moreover, the devices' pin one location may need to be rotated between the tray 220 and the test site position to match the contactor's electrical interconnect orientation. This was accomplished by the z-motor 244. Finally, conventional thermal soak plates 230, similar to the JEDEC trays 220, typically hold the devices "loose," or unsecured on a flat plate or in a pocket. As a result, even if accurately placed in the thermal soak plate 230, a downstream alignment for testing is almost always required, even with the thermal soak plates 230 providing a gross alignment.

The test handler head 210 can have a pitch change capability. A conventional model might have eight PnP tips split into two rows as shown in the figure, where each PnP tip has a separate Z-actuator 252 and vacuum 240. Each vacuum 240 can include a vacuum generator for device adhesion, a vacuum switch for device adhesion confirmation, and a vacuum ejector for device blow off. Additionally, a theta actuator might be required for each PnP tip for device rotation. These additional parts in the PnP head increase complexity, weight, cost, conversion time, and placement errors.

FIG. 2 additionally shows that each JEDEC tray 220 and soak plate 230 include individual, mechanically-separate pockets 222 for each device. Pockets 222 help to secure devices for soaking or while the devices are being moved and must be sized according to the size of the device. However, because each soak plate 220 must have mechanical separations for each pocket 222, soak plates 220 cannot be used for differently sized devices. Therefore, separate soak plates 220 must be used for different devices. This contributes to increasing the cost and complexity of a pick and place handler system, as in system 100A or 100B of FIGS. 1A and 1B, respectively. Additionally, the most common problem in conventional handlers is when a device is out of its pocket. Conventional test handler heads 210 can have difficulties placing devices in or picking devices from their corresponding pockets 222. In some conventional handler, devices are dropped into their pockets 222 instead of placed into. Dropping devices can lead to bounced devices and/or devices leaning incorrectly against an edge of their pockets.

Although not all conventional pick and place systems, handler heads, and soak plates are exactly as provided in FIGS. 1A-2, all conventional systems encounter similar design difficulties while aligning and securing devices through thermal testing. The various embodiments of the present disclosure address the limitations of conventional pick and place systems, handler heads, and soak plates.

FIGS. 3A-3D and FIG. 4 show various perspectives of an exemplary kit-less pick and place handler, according to embodiments of the present disclosure. An exemplary pick and place handler, according to the present disclosure, can include some or all of the features shown in FIGS. 3A-3D, in any combination.

Figure 3A:
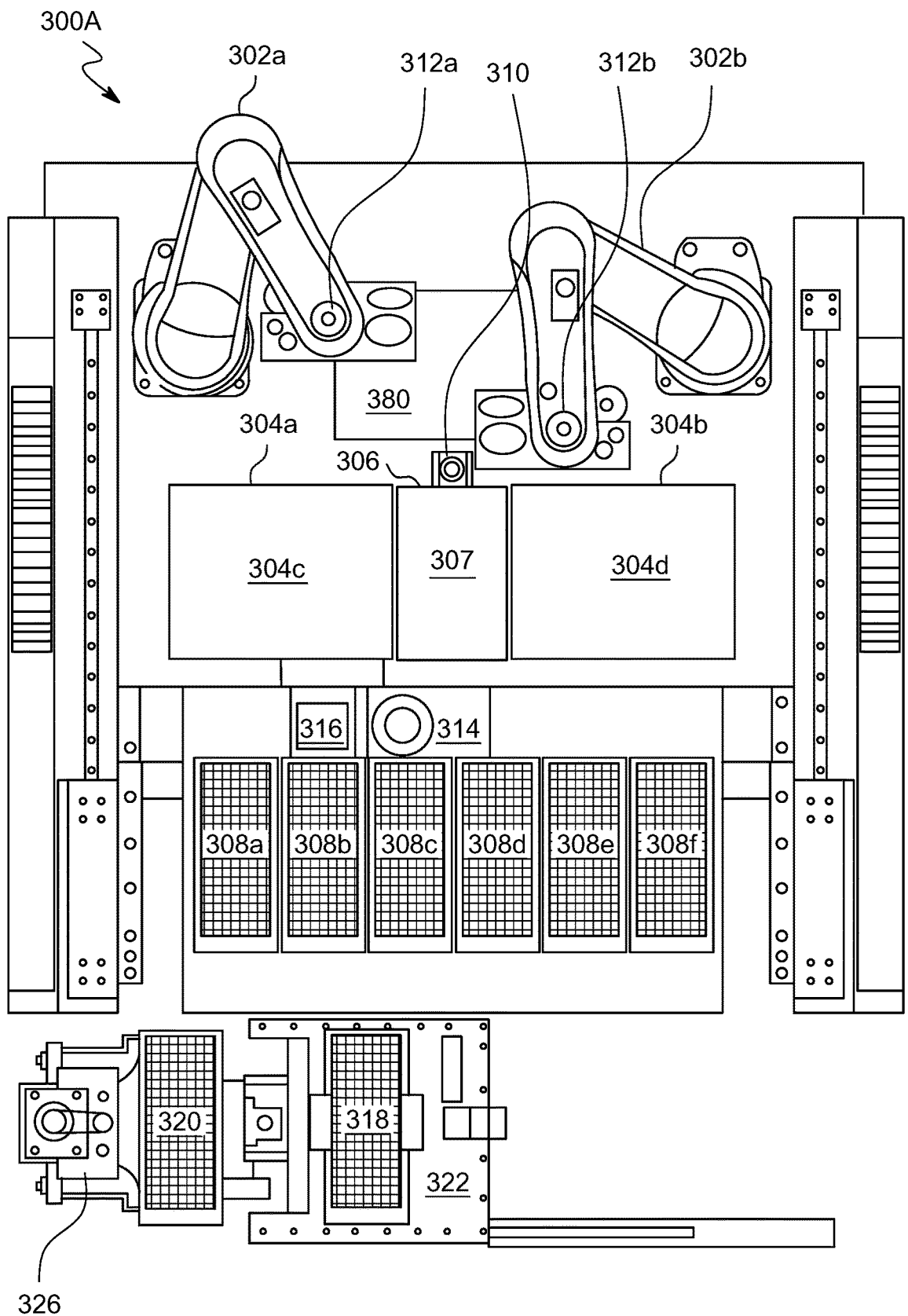
FIG. 3A shows a top-down perspective of an exemplary kit-less pick and place handler, according to an embodiment of the present disclosure.

System 300A in FIG. 3A can include prime movers 302a and 302b; soak plates 304a and 304b with surfaces 304c and 304d, respectively; de-soak plate 306 with surface 307; trays 308a, 308b, 308c, 308d, 308e, and 308f; a test site camera 310; prime mover cameras 312a and 312b; a handler camera 314; a first reticle 316; loading trays 318; an upper tray stack 320; a tray shuttle 322; a tray module 326; and a test site 380. System 300B of FIG. 3B can include many components and similar labels to system 300A of FIG. 3A. System 300C of FIG. 3C can include many components and similar labels to systems 300A and 300B, and system 300C can additionally include a gantry 330, a pick and place head 500, and gantry camera 390. System 300D of FIG. 3D can include many components and similar labels to systems 300A, 300B, and 300C, and system 300D can additionally include windows 340, 342, and 344. System 400 of FIG. 4 can include many components and similar labels to systems 300A, 300B, 300C, and 300D, and system 400 can additionally include movements 402, 404, and 406.

Figure 3B:
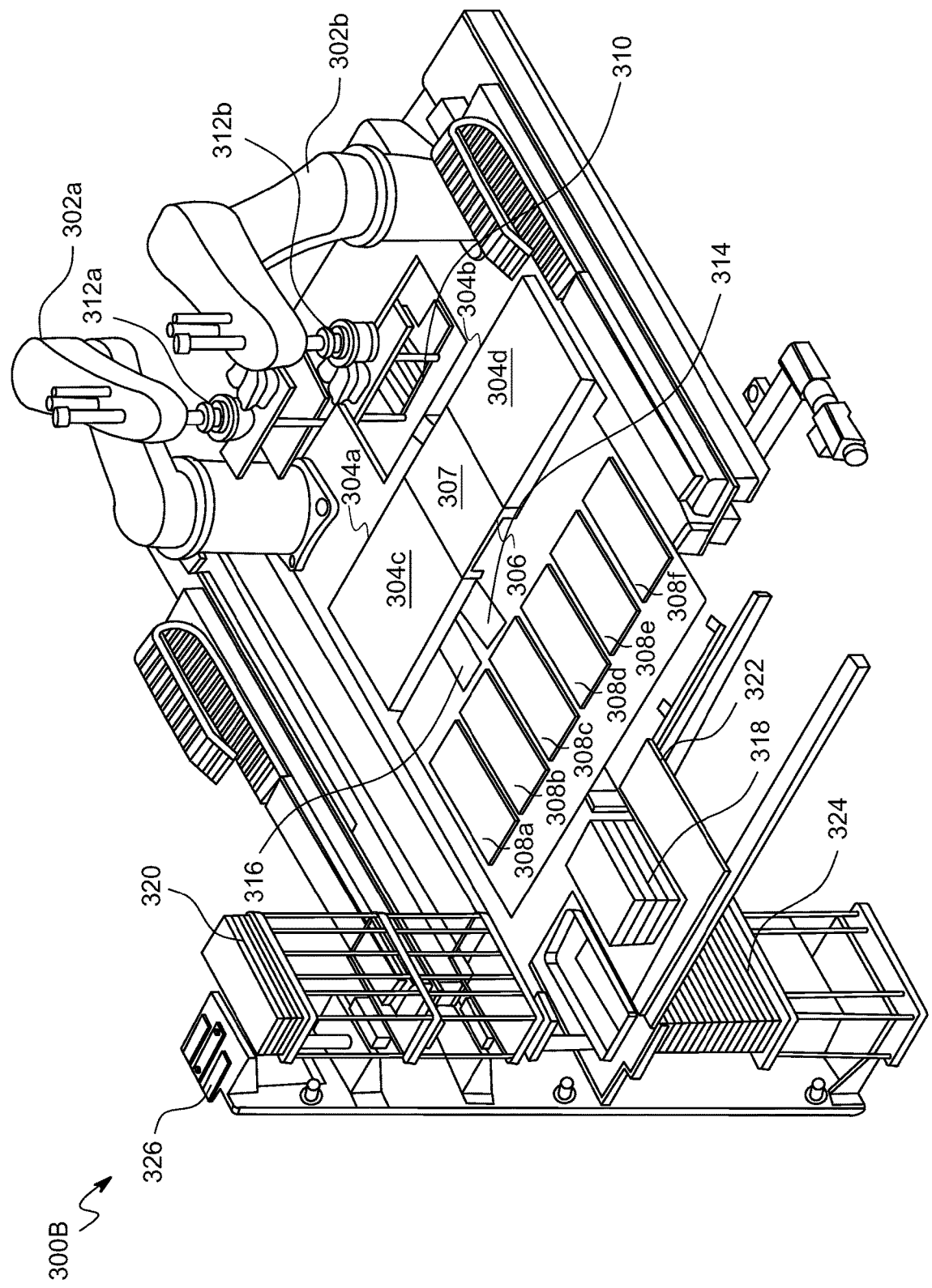
FIG. 3B shows a cut-away view of an exemplary kit-less pick and place handler, according to an embodiment of the present disclosure.

FIGS. 3A-3D provide for an efficient movement of trays according to a tray module 326. Tray module 326 can include an upper set of trays 320 and a lower set of trays 324. The trays can be moved from the tray module 326 via a tray shuttle 322. The tray shuttle 322 can additionally hold loading trays 318. FIG. 3B shows an exemplary embodiment where the handler 300B can handle a large stack of trays 320 and 324, and keep the trays segregated between tested and untested devices. For example, tested devices can be sorted into an upper stack at 320 and untested devices can be sorted into a lower stack 324. The module 326 can allow for multiple input and multiple sort bins of the same category while allowing for a single load and unload point at a convenient ergonomic height. This module 326 thus allows for any number of sort bins without the need for changeover or retooling. The module 326 can hold additional trays already in carriers in reserve such that trays can be quickly changed to present additional sort bins to be used in the system. Module 326 therefore allows for the dynamic assignment of input and sort tray positions while allowing for multiple input and multiple sort bins of the same category. Trays can be unloaded by effectively running the module backwards.

Figure 3C:
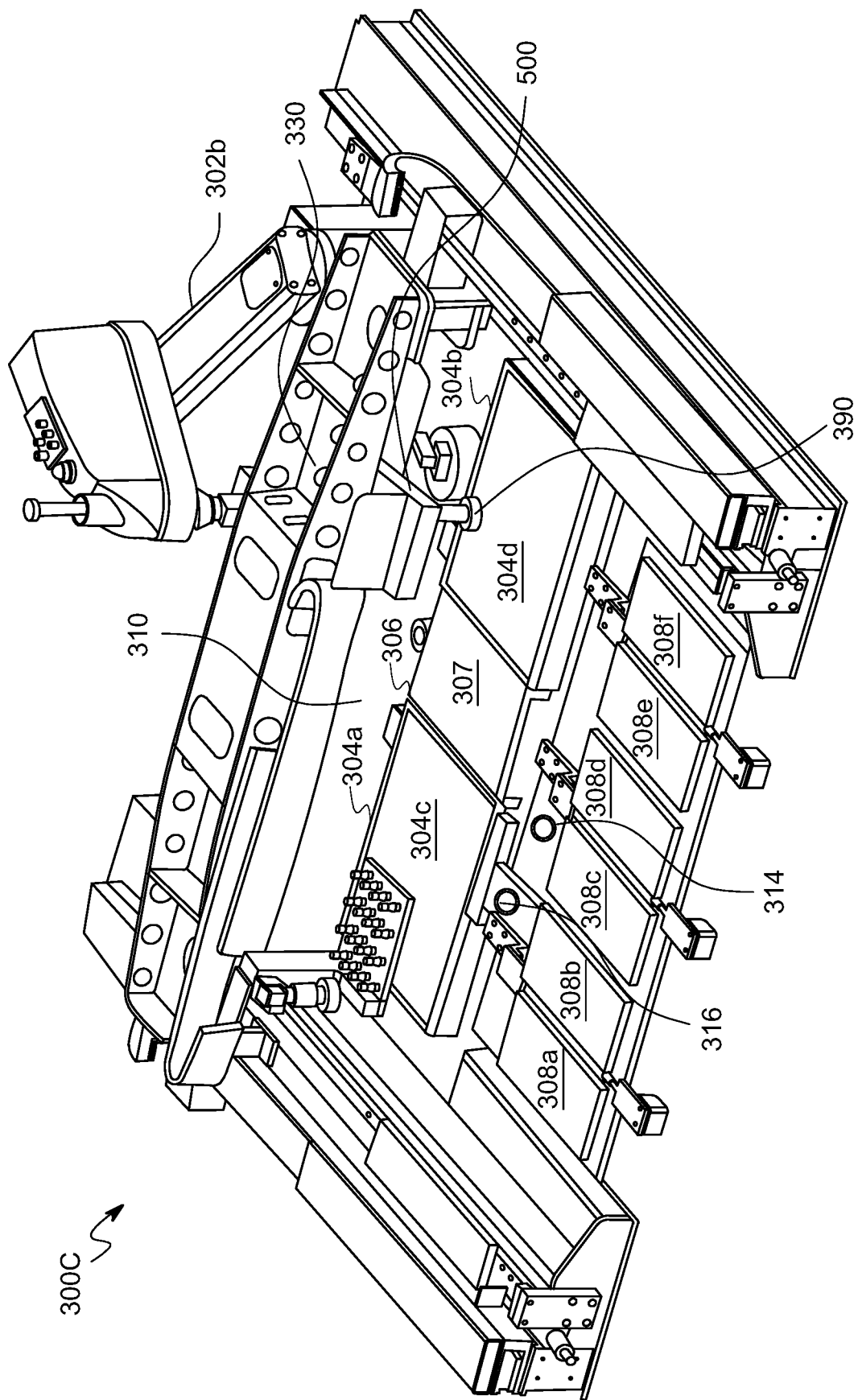
FIG. 3C shows another cut-away view of an exemplary kit-less pick and place handler, according to an embodiment of the present disclosure.

A kit-less pick and place handler, according to FIGS. 3A-3D can pick up devices via a XYZ head 500 on a gantry 330 from an input tray (e.g. trays 308a or 308b). The devices can then be placed on a kit-less soak plate 304a or 304b (kit-less soak plates are discussed further with respect to FIG. 7 below). This sequence can constitute a first movement 402 of the devices (as shown in FIG. 4). The devices can then be soaked at the soak plates 304a and 304b (soaking comprises setting devices to a desired temperature). A prime mover 302a or 302b can then move the devices from the soak plate (e.g. plate 304a or 304b) through a test site 380 to a de-soak plate 306. This can constitute a second movement 404 of the devices (as shown in FIG. 4). A gantry 330 can then move the devices from the de-soak plate 306 to a sort tray (e.g. tray 308e or 308f). This can constitute a third movement 406 of the devices (as shown in FIG. 4).

In a further description of movement 404, the second prime mover 302b can hold the devices at the test site 380 while thermal testing occurs. Testing can occur via a test contactor, which electrically contacts the device, and a test site actuator 395, which exerts force on the second prime mover 302b during thermal testing.

Therefore, the present disclosure provides a handler which can efficiently move devices through thermal testing with only three 'touches' or stops. This presents a substantial advantage over conventional handlers which have much more complicated movements and more frequent touching of the devices (for example, conventional handlers such as handler 100 FIG. 1B touch the devices at least seven times). Exemplary systems of the present disclosure minimize needs to reposition the devices and better maintenance of the devices' soak temperature.

Additionally, the present disclosure can provide the use of cameras (e.g. test site camera 310, prime mover cameras 312a and 312b, handler camera 314, and gantry camera 390), which can be used to verify alignment, orientation, and position of each device. The cameras 310, 312a, 312b, 314, and 390 can coordinate to visually align the devices, and perform a visual alignment of the handler system as a whole. In some examples, the cameras 310, 312a, 312b, 314, and 390 can include lighting devices or receive light from nearby lighting apparatus (not shown).

In an exemplary vision alignment strategy, the handler camera 314 and the gantry camera 390 can be located with respect to each other by imaging both cameras 314 and 390 with a first reticle 316. This can create a base reference coordinate system. The gantry camera 390 can then locate the soak plates 304a and 304b, the de-soak plate 306, and the trays 308a, 308b, 308c, 308d, 308e and 308f Prime mover cameras 312a and 312b can be located and planarized with respect to test site camera 310 by using a second reticle (not shown). The second reticle can be hand-installed or actuated by a mechanism next to camera 310. In some examples, prime mover cameras 312a and 312b can be planarized via an upward looking laser (not shown). Prime mover cameras 312a and 312b can additionally locate the soak plates 304a and 304b, contactor fiducials (not shown). Gantry camera 390 can verify a location of the devices in the trays 308a, 308b, 308c, 308d, 308e, and 308f and identify positions of the trays 308a, 308b, 308c, 308d, 308e, and 308f. Handler camera 314 can be used to locate an X, Y, and theta of devices after they are picked by XYZ head 500. Such a vision alignment protocol can further allow the devices to be moved according to movements 402, 404, and 406 while an exact position of the devices is known.

Therefore, an exemplary vision alignment process in a system such as systems 300A, 300B, 300C, and 300D can correct X, Y, and Theta positions of the devices directly before entering the test site 380. Conventional systems have loose devices during all movements before entering the test site and then require extremely quick corrections due to timing requirements of the test site and the handler system as a whole. The efficiency of the handlers of the present disclosure allow corrections to occur without a timing requirement.

This vision alignment process reduces alignment needs by performing a good initial alignment using the kit-less soak plates 304a and 304b and transferring the kit-less soak plates 304a and 304b to the testing area 380. Thus, the only critical subsequent motion needed is the placement in the test site 380. Therefore, if a good alignment on the soak plates 304a and 304b is performed, little or no correction of alignment is needed during testing. As a result, device moves are minimized, and throughput of the system is increased.

Moreover, since the system is two-sided with two soak plates 304a and 304b and two prime movers 302a and 302b, this means that the test site 380 can be in continuous use. Thus, while one soak plate 304a or 304b is being loaded, testing of devices on the other soak plate can occur. As a result, the test site 380 is not idle during normal operations.

The exemplary test handler illustrated in FIGS. 3A-3D and 4 can align devices according to a vision alignment strategy, and reduce potential of device damage during movement. The test handler further provides for a kit-less device handling system that diminishes induced PNP positional errors, eliminates handling transfers, and reduces complexity/costs of the mechanisms involved, while allowing a high throughput.

As would be readily understood by someone skilled in the art, various modifications are contemplated by the present disclosure. For example, although six trays 308a, 308b, 308c, 308d, 308e, and 308f are shown in FIGS. 3A-3D and 4, the present disclosure contemplates that any number of trays can be used. Similarly, although two soak plates 30a and 304b and two prime movers 302a and 302b are shown in FIGS. 3A-3D and 4, the present disclosure contemplates that any number of soak plates and prime movers can be used so long as there is at least one of each (as discussed later with respect to FIGS. 10A-10B). Although transport of devices via prime movers 302a and 302b in the exemplary implementations is primarily described with respect to a gantry system or a robot system, this is solely for ease of explanation. In the various implementations, any type of prime mover system can be used. These can include gantry systems, robotic systems, or combinations of both, among others, as known in the art.

Figure 5A:
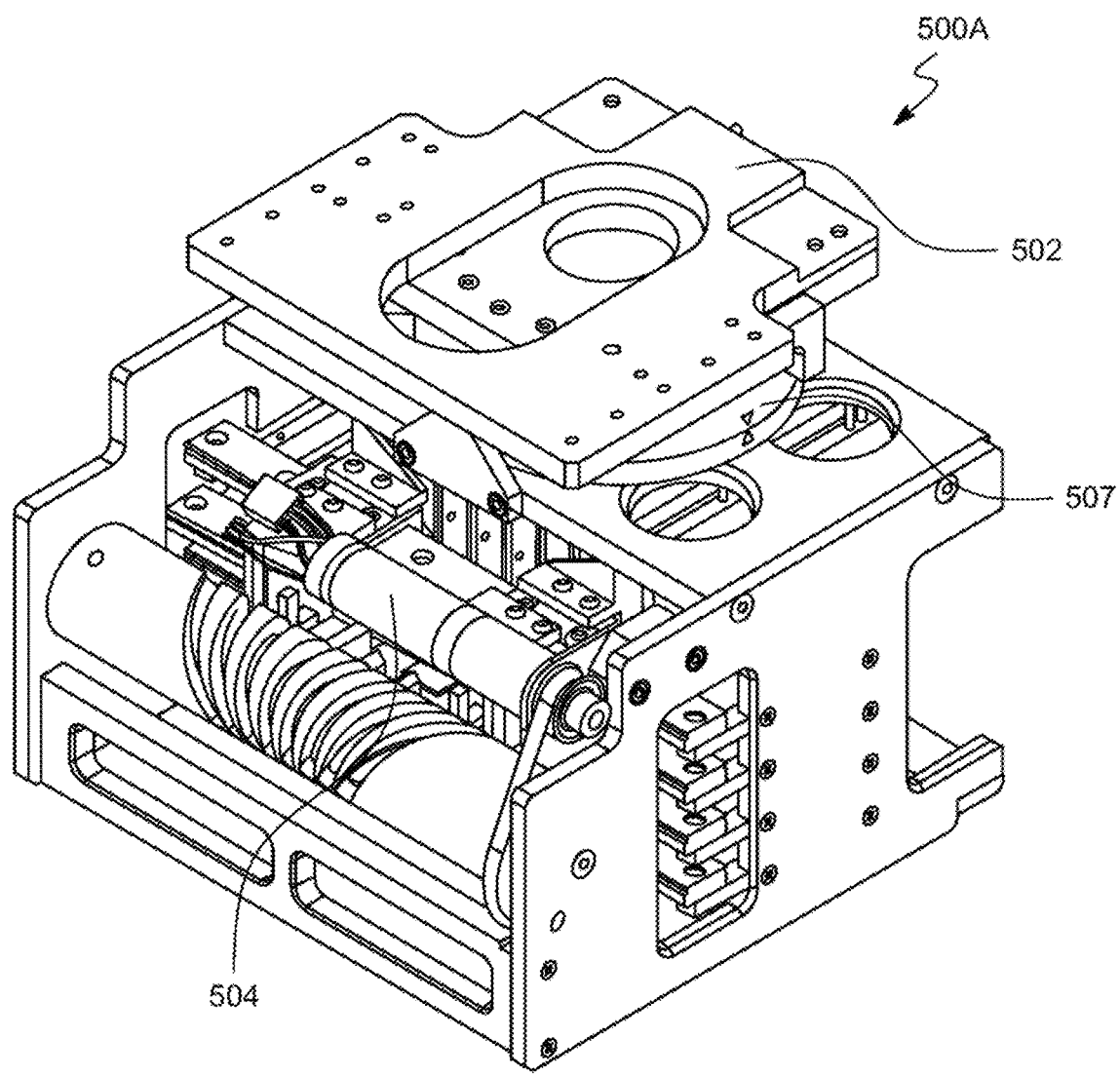
FIG. 5A shows an exemplary XYZ head for picking and placing devices, according to an embodiment of the present disclosure.
Figure 5B:
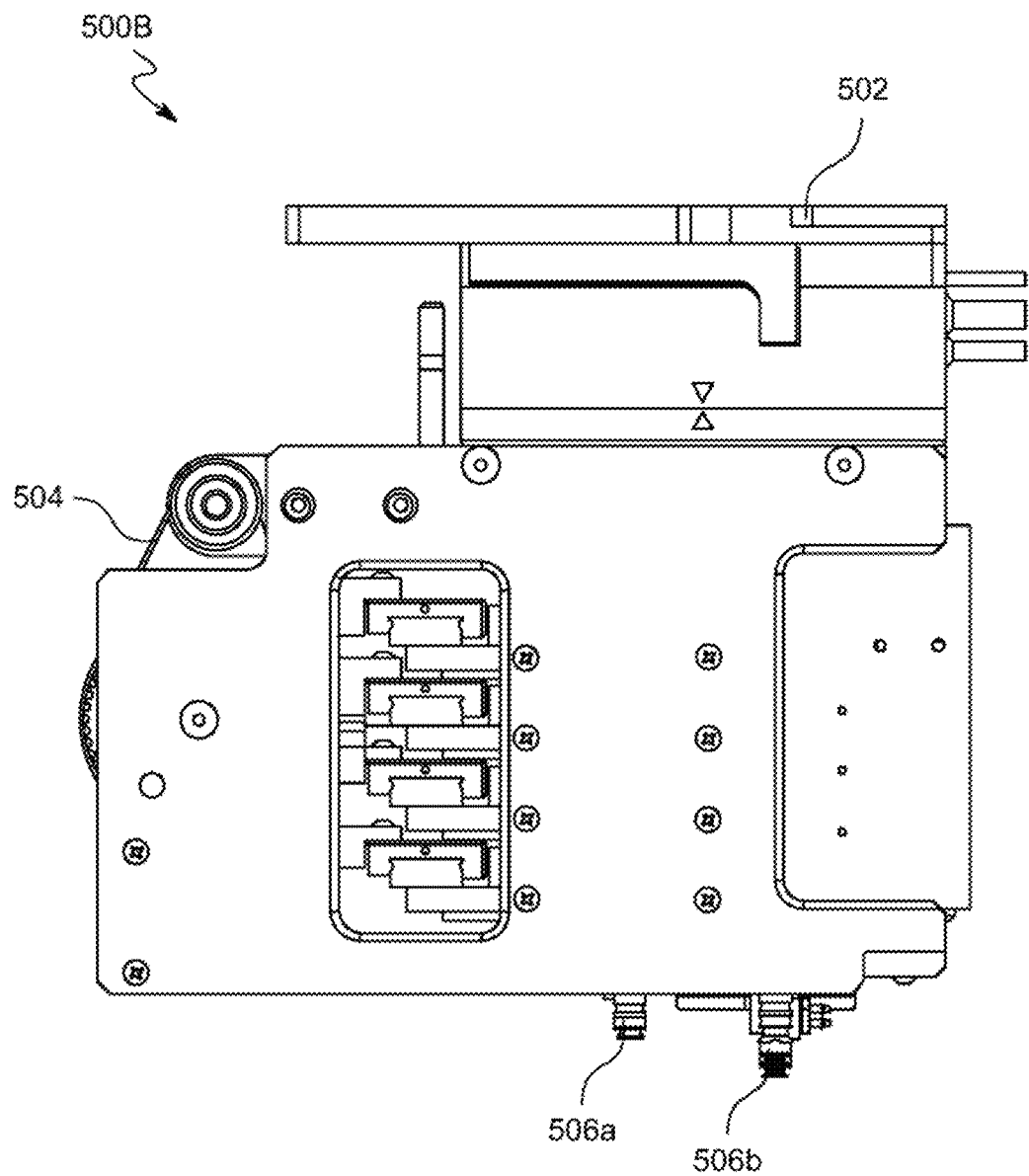
FIG. 5B shows a side view of an exemplary XYZ head, according to an embodiment of the present disclosure.
Figure 5C:
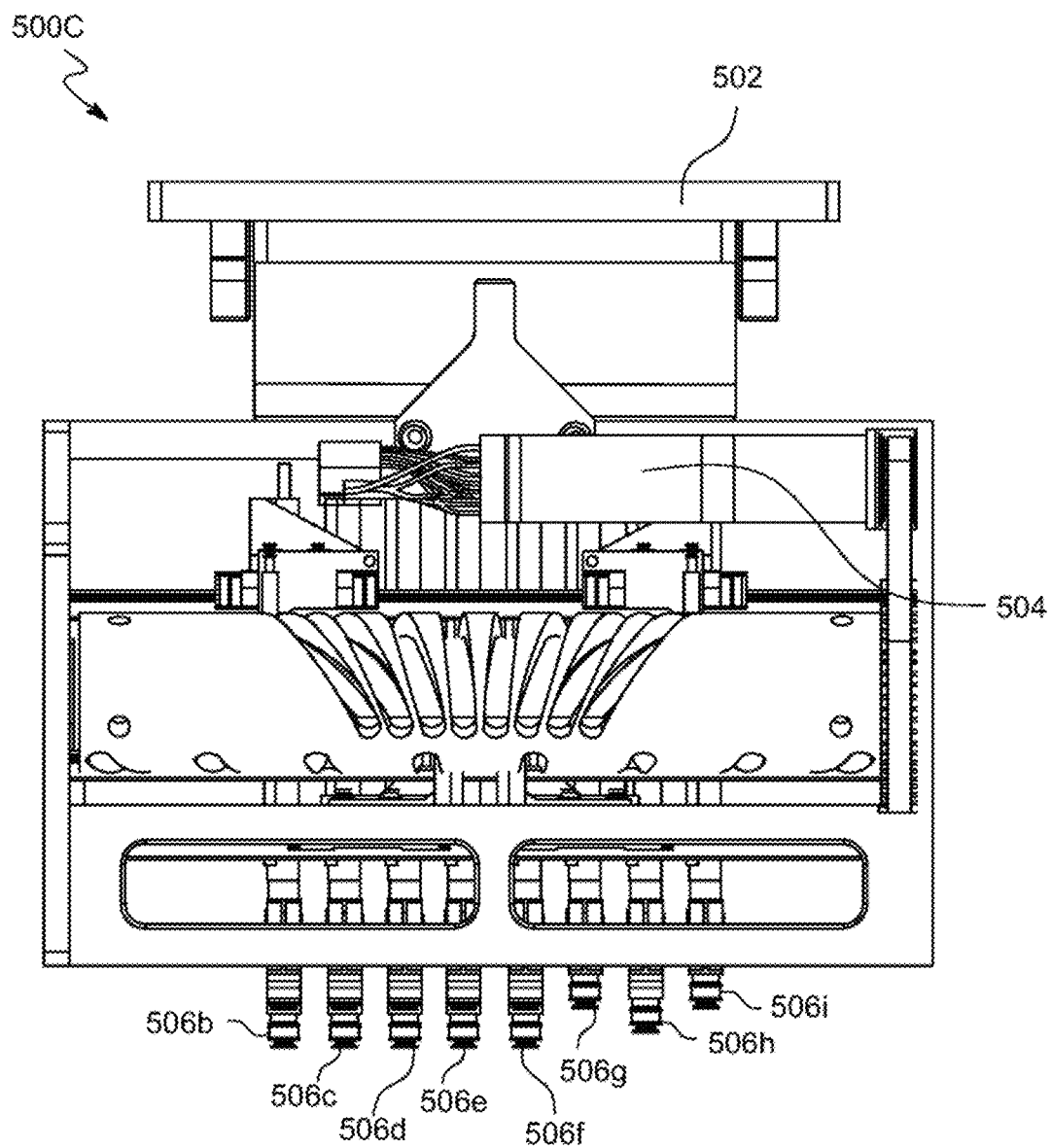
FIG. 5C shows a front view of an exemplary XYZ head, according to an embodiment of the present disclosure.

FIGS. 5A-5C show various perspectives of an exemplary XYZ head 500, according to embodiments of the present disclosure. For example, XYZ head can be the XYZ head 500 as shown in FIG. 3C., or XYZ head 500A, as shown in FIG. 5A. XYZ head can include a gantry mount 502, a roll cam 504, and an actuator 507. XYZ head 500B (as shown in FIG. 5B) and XYZ head 500C (as shown in FIG. 5C) can include many components and similar labels to XYZ head 500A of FIG. 5A, and can additionally include pick heads 506 (e.g., 506a-506b in FIG. 5B, or 506a-506i in FIG. 5C). Gantry mount 502 can secure XYZ head 500 to a gantry (for example, gantry 330 as in system 300C of FIG. 3C).

In this example, roll cam 504 can operate to change the pitch of heads 506 in the x-axis of a handler (for example handler 300A, 300B, 300C, or 300D of FIGS. 3A-3D, respectively). This pitch change can also occur while the XYZ head 500 is in motion to reduce the overall dwell time between picking and placing device. Roll cam 504 can be driven with actuator 507 or another prime mover. Pick heads 506 can be raised, lowered, individually moved with and/or mounted to a linear actuator or motor to move between several positions. This movement is demonstrated in the different positions of heads 506f, 506g, and 506h, for example.

In some examples of the present disclosure, the XYZ head 500 can have the theta position changed with a rotary mechanism 507. In another example, the theta rotation can occur via a linear actuator or motor which simultaneously changes the theta position of all devices picked up by heads 506 on the XYZ head 500.

In some examples of the present disclosure, XYZ head 500 can include an X/Y pitch change with a complex mechanism on the XYZ head 500 so that a theta correction would be done at a later time, perhaps even just prior to test.

Another alternate method can include operating all pick and place heads 506 by a prime mover (e.g. prime mover 302a or 302b of FIGS. 3A-3D). The pick and place heads 506 can be operated either individually on the XYZ head 500 or simultaneously with one prime mover for the entire XYZ head 500.

In some examples, XYZ head 500 can be a turret.

Figure 6A:
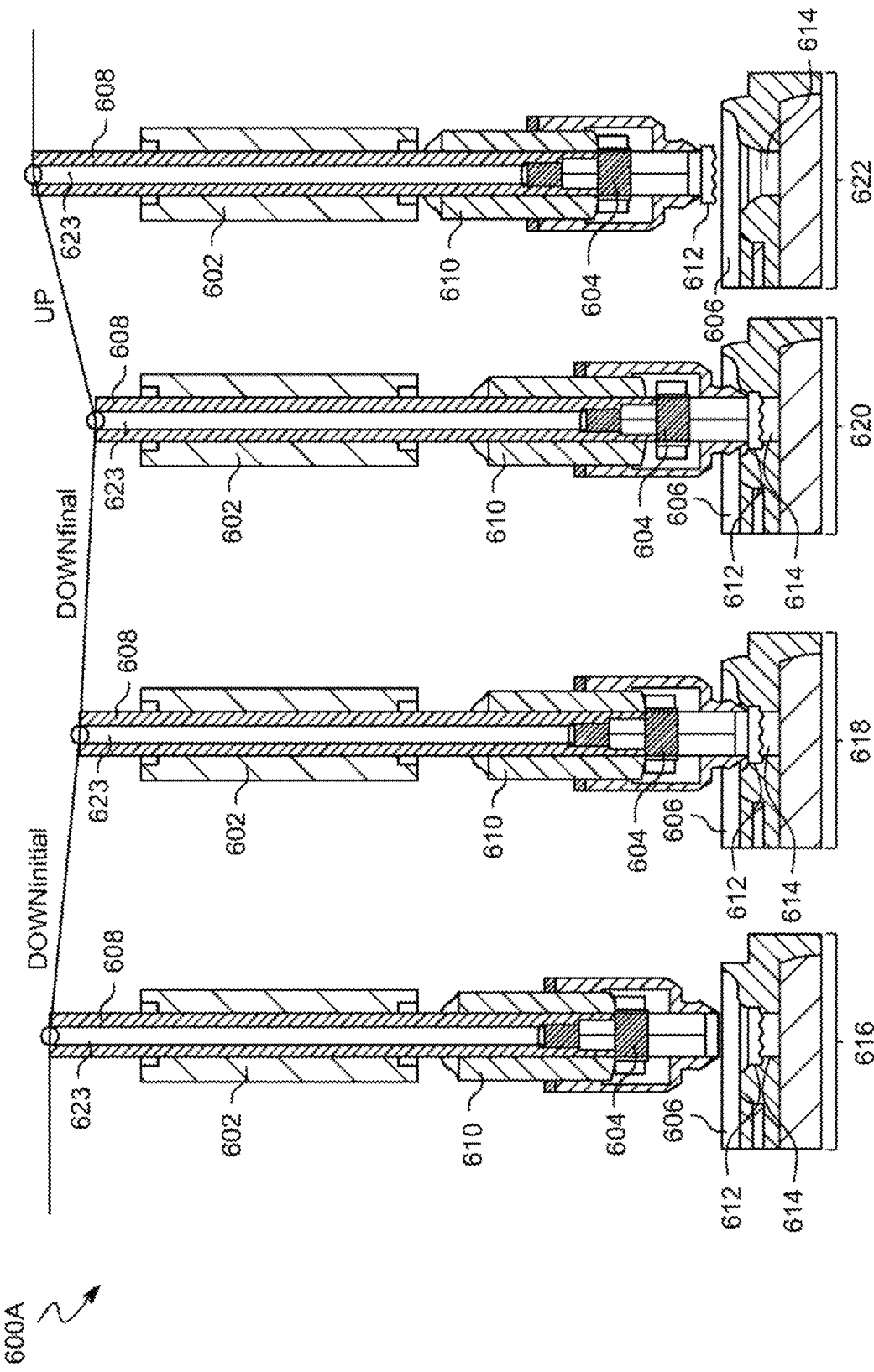
FIG. 6A shows a cut-away view of a pick and place head picking a device up, according to an embodiment of the present disclosure.
Figure 6B:
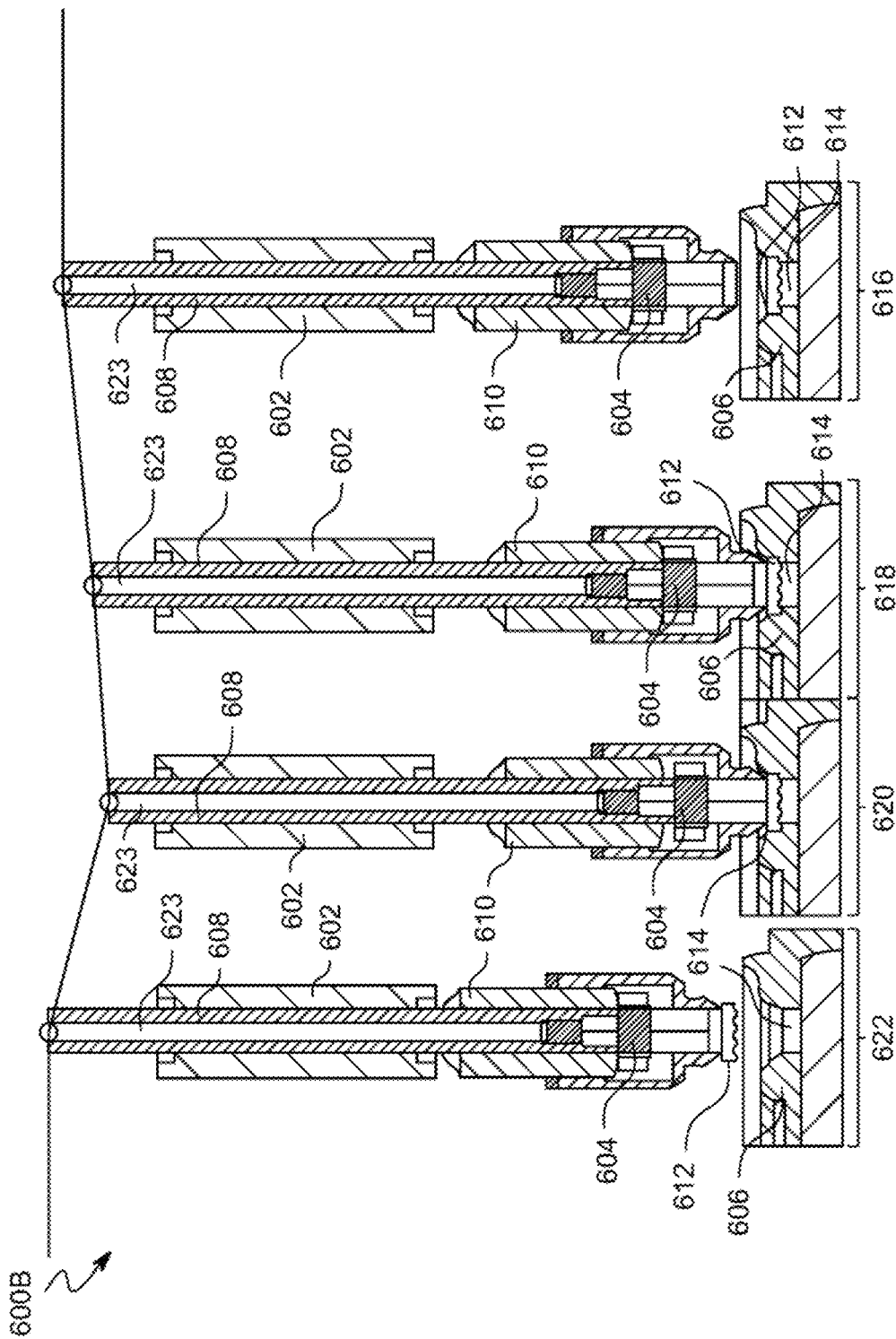
FIG. 6B shows a cut-away view of a pick and place head placing a device, according to an embodiment of the present disclosure.

FIGS. 6A-6B show exemplary pick and place head systems 600A and 600B, which use a vacuum to pick up and place devices, according to embodiments of the present disclosure. Each pick and place head system 600A and 600B can be, for example, the pick heads 506 of FIGS. 5A-5C. Referring back to FIG. 6A, an exemplary pick and place head system 600A can include a z-linear bearing 602, a pick and place (PNP) tip 604, a tray 606, a z-shaft 608, a stripper assay 610, a device 612, a tray opening 614, and a rod 623. Pick and place head system 600B can include many components and similar labels to pick and place head system 600A of FIG. 6A. FIGS. 6A-6B further show an improved device sensing strategy with which each device is sensed digitally via a proximity sensor (not shown) rather than via vacuum.

Systems 600A and 600B can reduce the time needed to sense a device and decrease the bulk of hardware and tubing/wires that needs to be moved by a X/Y Gantry (e.g. gantry 330 of FIGS. 3A-3D) or the prime mover (e.g. prime movers 302a and 302b of FIGS. 3A-3D). Rod 623 can operate inside z-shaft 608 and can move independently of linear bearing 602. Z-shaft 608 moves up and down vertically to properly position a height of device 612. Z-shaft 608 can also operate as a vacuum, and sense whether a device 612 has been picked up or placed based on a vacuum level of the z-shaft 608. For example, the vacuum level increases when a device 612 is picked up (e.g. as shown in FIG. 6A), and decreases when a device 612 is placed (e.g. as shown in FIG. 6B). Further, a device 612 can be removed from the stripper assay 610 by activating rod 623 to shear the device 612 away from the PNP tip 604 (such as in position 618). A stationary stripper assay 610 can sense a down position (e.g. position 618 or 620) of the head by measuring the force change in the actuator moving the head up and down (e.g. moving between positions 616 and 618). This method also allows for the head to be recalibrated for each pick and place operation to further improve the reliability and accuracy of the pick and place operation.

In one example, a vacuum is always on and the devices 612 are stripped off the PNP tip 604 while the vacuum is on. Each PNP tip's 604 z-position of the stripper assay 610 is learned as a "DOWNfinal" value, as shown in position 620. The "DOWNfinal" value is the learned move that the tip must move to pick and place the device 612. During operation, the low mass stripper assay 610 contacts the device 612 first to gauge a relative z-position of the device 612. A z-move can then be completed using the learned "DOWNfinal" values.

FIG. 6A illustrates exemplary movements of a pick and place head 600A as it calibrates, and moves downward to pick up a device 612. Although the pick and place head 600A subsequently picks up the device in position 622, in some instances, the pick and place head 600A can subsequently strip the device 612. The PNP tip 604 can have a force sensor at the bottom of the head which moves with the PNP tip 604, detects relative movement, and detects an end of travel when the PNP tip 604 comes into contact with a tray 606. For example, the tray 606 can be a calibration block. In some instances, the stripper assay 610 can come into contact with the tray 606, as in position 618, and then the force sensor will move down to detect the end of the travel, as in position 620.

FIG. 6A also illustrates an exemplary movement of a pick and place head 600B picking up a device 612. The PNP tip 604 moves down towards the tray 606 at position 616, and the force sensor moves as well while detecting the relative movement of the head 600B. For example, the tray 606 can be a JEDEC tray. The stripper assay 610 comes into contact with the tray 606 first, as in position 618, and then the force sensor moves a distance, "DOWNfinal", towards the device 612 as in position 620. The force sensor can verify presence of the device 612, and then move upwards, as in position 622.

FIG. 6B also illustrates an exemplary stripping operation for the PNP tip 604 where the PNP tip 604 can move downwards, as from position 622 to position 620, and then upwards from position 618 to position 616 while stripping the device 612 from the force sensor in a single move. This provides a digital method of sensing the presence of a device 612 without using a vacuum and allows for more heads 600B and more devices 612 to be located in a smaller overall area. A z-height can be automatically set by determining a force differential as seen by the stationary z-linear bearing 602 in the head. A mechanical method can remove the device 612 from the vacuum cup by holding the device 612 in place and removing the vacuum cup from the device 612.

In some examples of FIGS. 6A and 6B, the stripper assay 610 can be an ejector or any other means of mechanically removing a device from a pick and place head.

Kit-Less Device Handling Methodology

An important feature of the various embodiments of the present disclosure is the use of kit-less handling. As noted above, conventional test handling systems utilize thermal soak plates (e.g. plate 230 of FIG. 2), which have machined pockets 222 for devices. These pockets 222 have positional errors and clearance for the device. This prevents the pockets 222 from being used to facilitate accurate device alignment, since position of the device is dictated, at least in part, by the shape of the pockets 222. An additional requirement for accurate device alignment is that the devices must be placed in a position that matches the test site contactor position and matrix. Conventional thermal soak plates have device pocket placement to maximize the number of devices for thermal soak UPH. This prevents direct transfer to the test site contactors in the required pattern while being correctly aligned.

Figure 7:
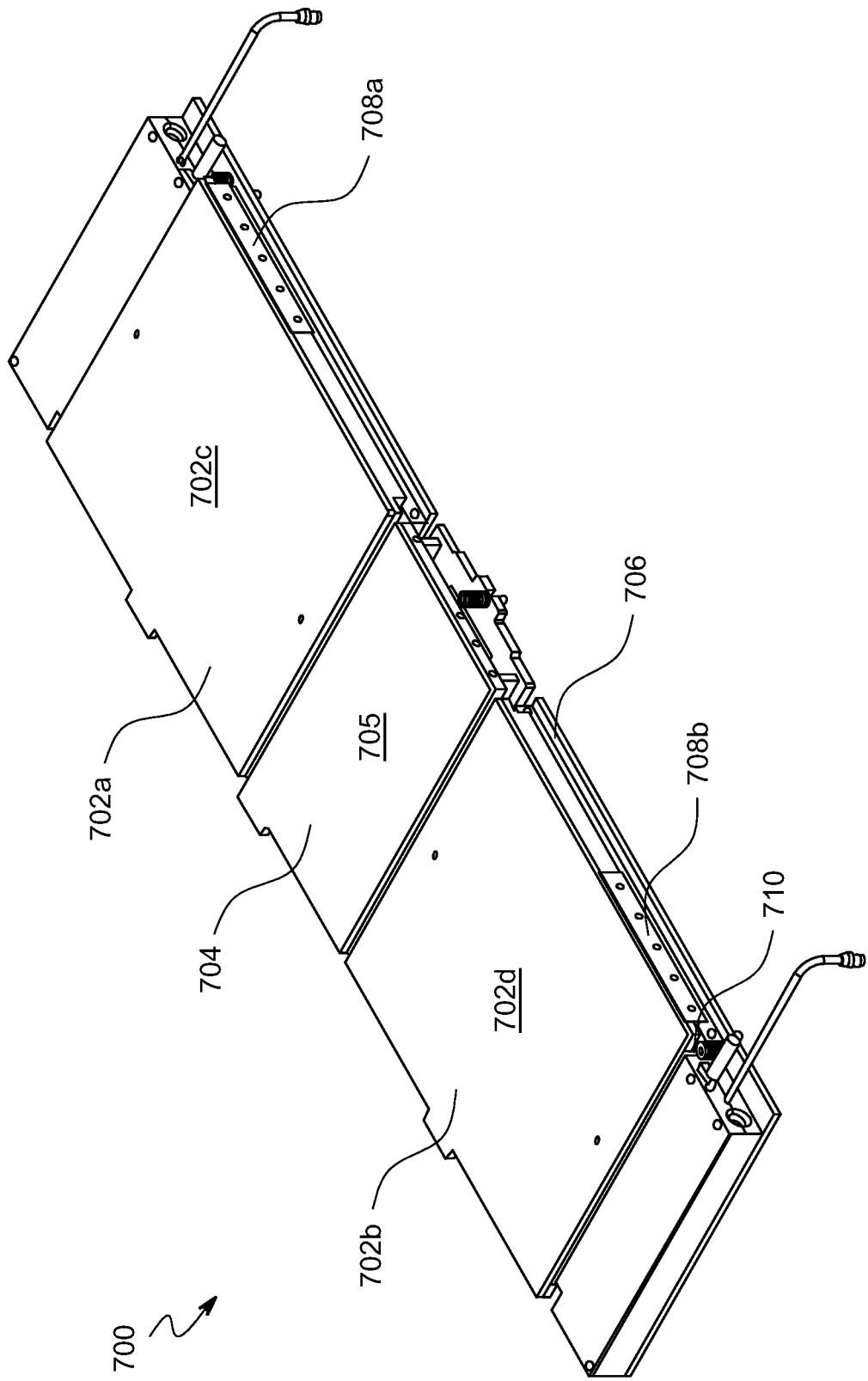
FIG. 7 shows an exemplary soak and de-soak plate, according to an embodiment of the present disclosure.

The various embodiments of the present disclosure provide for kit-less components, as shown by an exemplary soak and de-soak plate 700 in FIG. 7. Plate 700 can include soak plates 702a and 702b, de-soak plate 704, base plate 706, first alignment plates 708a and 708b, and second alignment plate 710. For example, plate 700 can be used with respect to various embodiments of the present disclosure, including soak plates 304a and 304b and de-soak plate 306 of FIGS. 3A-3D.

Soak plates 702a and 702b and de-soak plate 704 can include tacky surfaces 702c, 702d, and 705, respectively, configured hold devices in place due to a friction between the plate 702a, 702b, and 704 and the device. A tacky or high coefficient of friction material can hold or align the devices in place while they soak. When such a material is used, no additional custom tooling is required to align the device again or hold the device in place. A top plate (e.g. 702a, 702b, 704) can be easily changed out, and held in place by vacuum or other means. A top plate (e.g. 702a, 702b, 704) can be aligned to the thermally controlled base plate 706 by alignment plates 708a, 708b, and 710. The present disclosure contemplates that more or fewer alignments plates 708a, 708b, and 710 can be used. Another method can provide for using alignment pins to position the soak plates 702a and 70b relative to the thermally controlled base plate 706.

Soak plates 702a and 702b can be used to thermally condition the devices prior to test. De-soak plate 704 can be used to cool or warm the devices after test. Although both the de-soak plate 704 and the soak plates 702a and 702b use different methods of heating and/or cooling, they can be constructed similarly. The tacky surfaces 702c, 702d, and 705 on plates 702a, 702b, and 704, respectively, can withstand the extreme temperatures needed for a test handler, for example between −80 degrees Celsius to 200 degrees Celsius. The tacky surfaces 702c, 702d, and 705 can have anti-static and static dissipative properties. The tacky surfaces 702c, 702d, and 7025 can also be non-silicone, resilient to dampen normal handler vibrations, and thermally conductive to allow thermal conditioning of the devices. An exemplary thermal soak plate 702a or 702b with the tacky and kit-less properties, according to the present disclosure, can be kept at a constant temperature, which eliminates any induced errors caused by thermal expansion. Normal soak plate functionality is maintained for the needed thermal conditioning/soaking.

The kit-less tacky soak plates 702a and 702b can therefore hold devices in position to soak. The devices can then be picked by another mechanism and inserted into a test site contactor (for example, as provided for with respect to FIGS. 3A-3D). The priority in the handler is to keep the test site fed without any induced delays caused by device transportation or other problems. Therefore, soak and de-soak plate 700 can keep devices located as opposed to loose in a positional pocket, keep the devices from becoming dislodged or bouncing, and ensure that only static dissipative surfaces come into contact with the device leads. This can prevent the device leads from having electro-static-discharge due to coming in contact with an electrically insulative or electrically conductive surface.

Figure 3D:
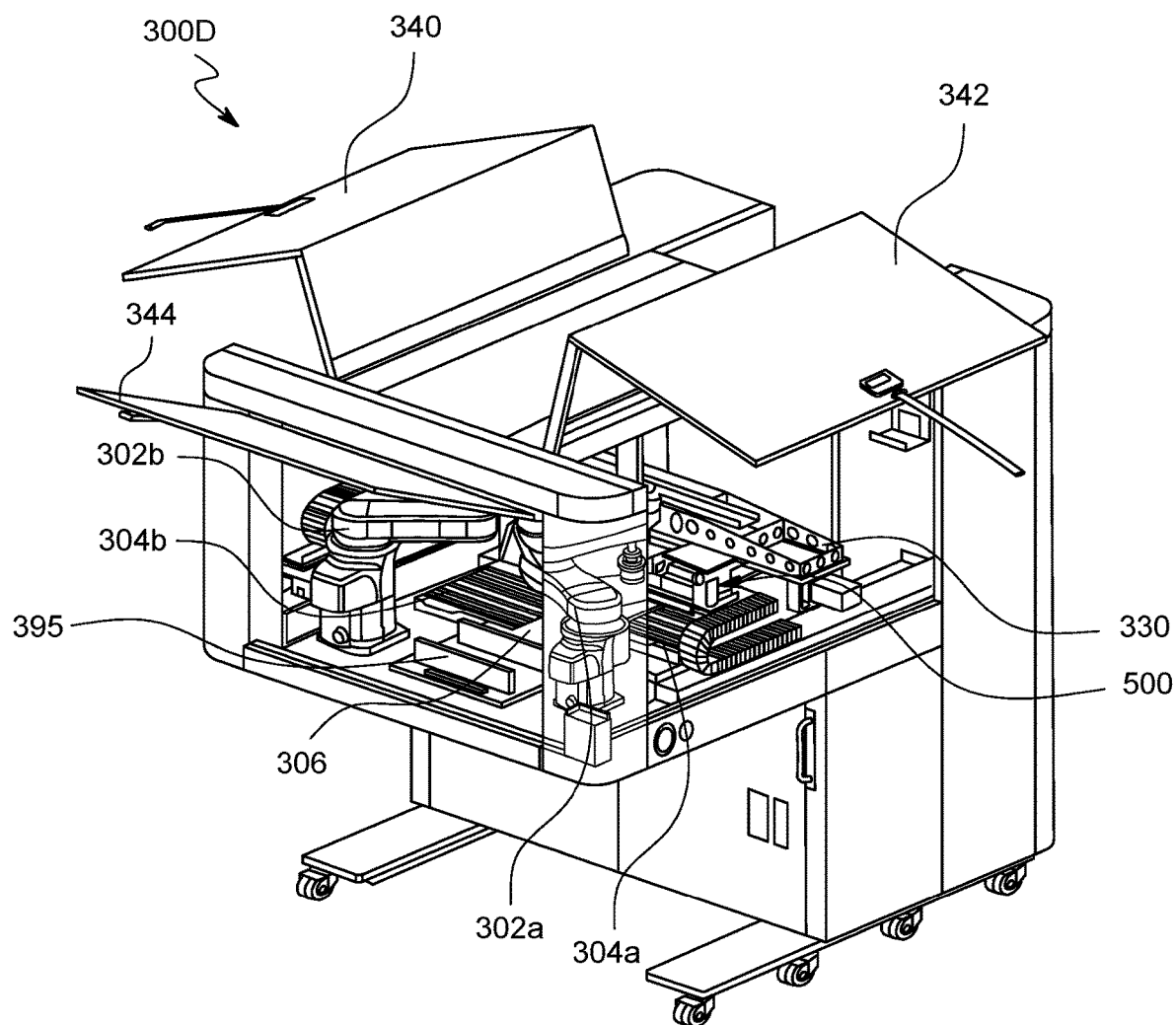
FIG. 3D shows a rear perspective view of exemplary kit-less pick and place handler, according to an embodiment of the present disclosure.
Figure 4:
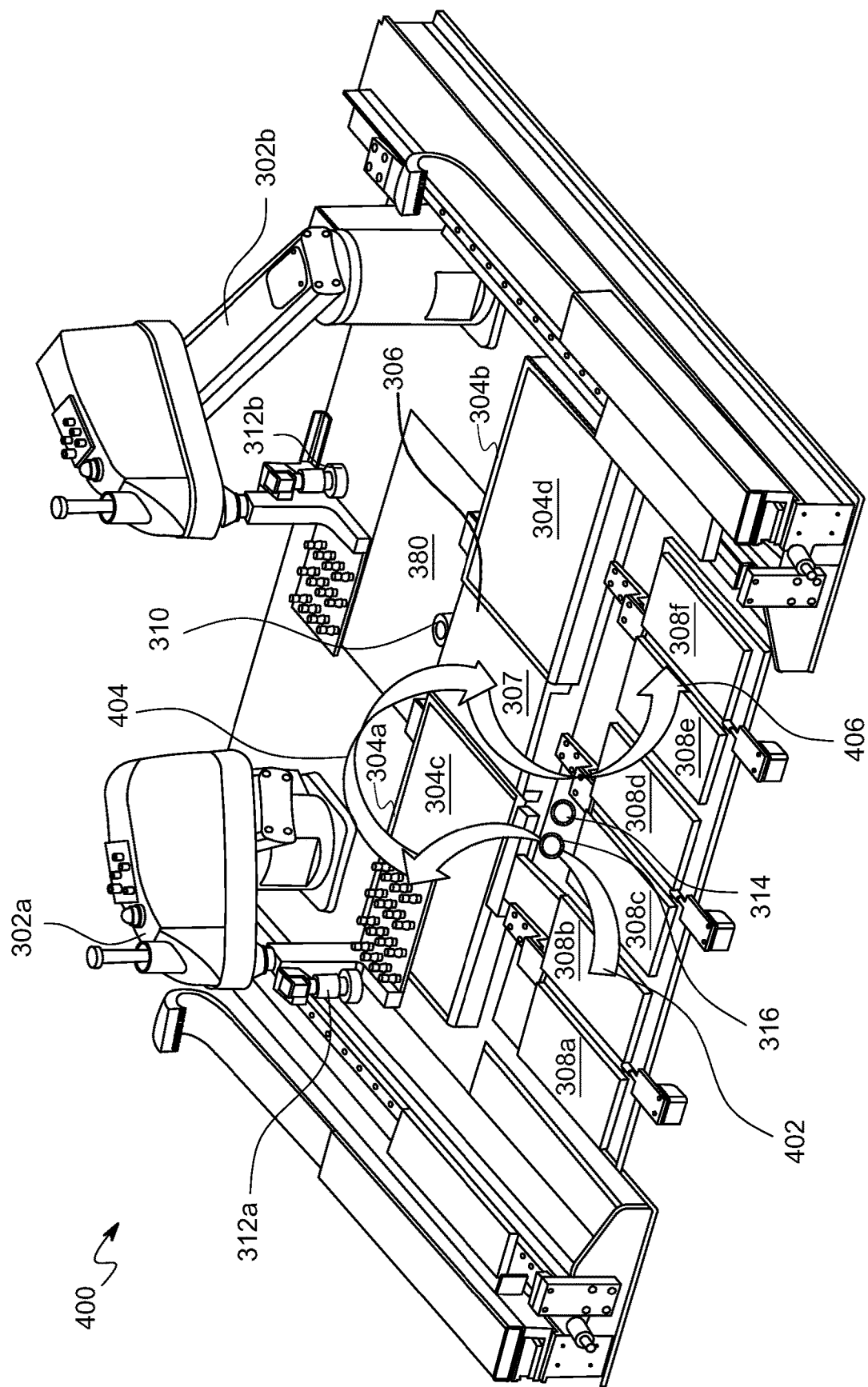
FIG. 4 shows an exemplary movement path through a kit-less pick and place handler, according to an embodiment of the present disclosure.

Thermal soak plates 702a and 702b can be positioned as shown by soak plates 304a and 304b in FIGS. 3A-3D; that is, the soak plates can reside primarily between the trays 308 and the test site 380, and can be accessed by prime movers 302a and 302b and gantry 330. Thermal soak plates 702a and 702b can raise and lower the temperature of devices so that the devices reach the appropriate test temperature. De-soak plate 704 can be used to bring the device from the selected test temperature to room temperature or above room temperature. As further shown in FIG. 3D, the area around the soak plates is typically enclosed by doors 340, 342, and 344. This area can be purged with dry air (such as Clean Dry Air (CDA)) or nitrogen or another gas to keep the area dry when the soak plates are operating below the dew point of the air inside the enclosed area. Therefore, the configuration as shown in FIG. 3D can eliminate frost inside the area enclosed by windows 340, 342, and 344.

However, other means of holding devices in place are contemplated for the various embodiments. For example, in other embodiments, a soak plate can be porous or have a large number of holes in a vacuum plate. The vacuum can then be used to hold the devices in place. An exemplary embodiment of this method could be a perforated metal where a vacuum is drawn to hold the device in place. Another exemplary embodiment could be a powered metal that is porous and allows a vacuum to be drawn to hold the device in place. In another exemplary embodiment, a pocket that holds different sized devices based on the funnel or steps that are machined in the pocket. This machined pocket would be able to precisely locate the device.

The soak and de-soak plate 700 allows maintaining accurate positions of the devices without any errors caused by clearances or device movement. In certain embodiments, this can be accomplished by using thermal soak plates 700 that have a surface material with sufficient tackiness. The tackiness can temporarily fix the devices placed by a PnP head, and prevent further device movement before reaching the test site. That is, pockets are neither required nor desired. As noted above, machined "change kit" specific components, like the machined pocketed thermal soak plate, add to the cost and lead time for new device kits on a system. In contrast, the proposed tacky surface of the soak and de-soak plate 700 is kit-less and universal. Therefore, any matrix placed by a PnP head to match a test site pattern can be provided for and, more importantly, the positions of the devices in that matrix can be maintained throughout the testing process.

The versatility of the kit-less platen eliminates changeover that was customarily necessary to handle new or differently-sized devices. Additionally, by ensuring the device is precisely located during thermal soak, this limits the number of device handoffs in the test handler, and improves device placement accuracy at the test site.

Use of Tray Frames by Tray Module

Figure 8A:
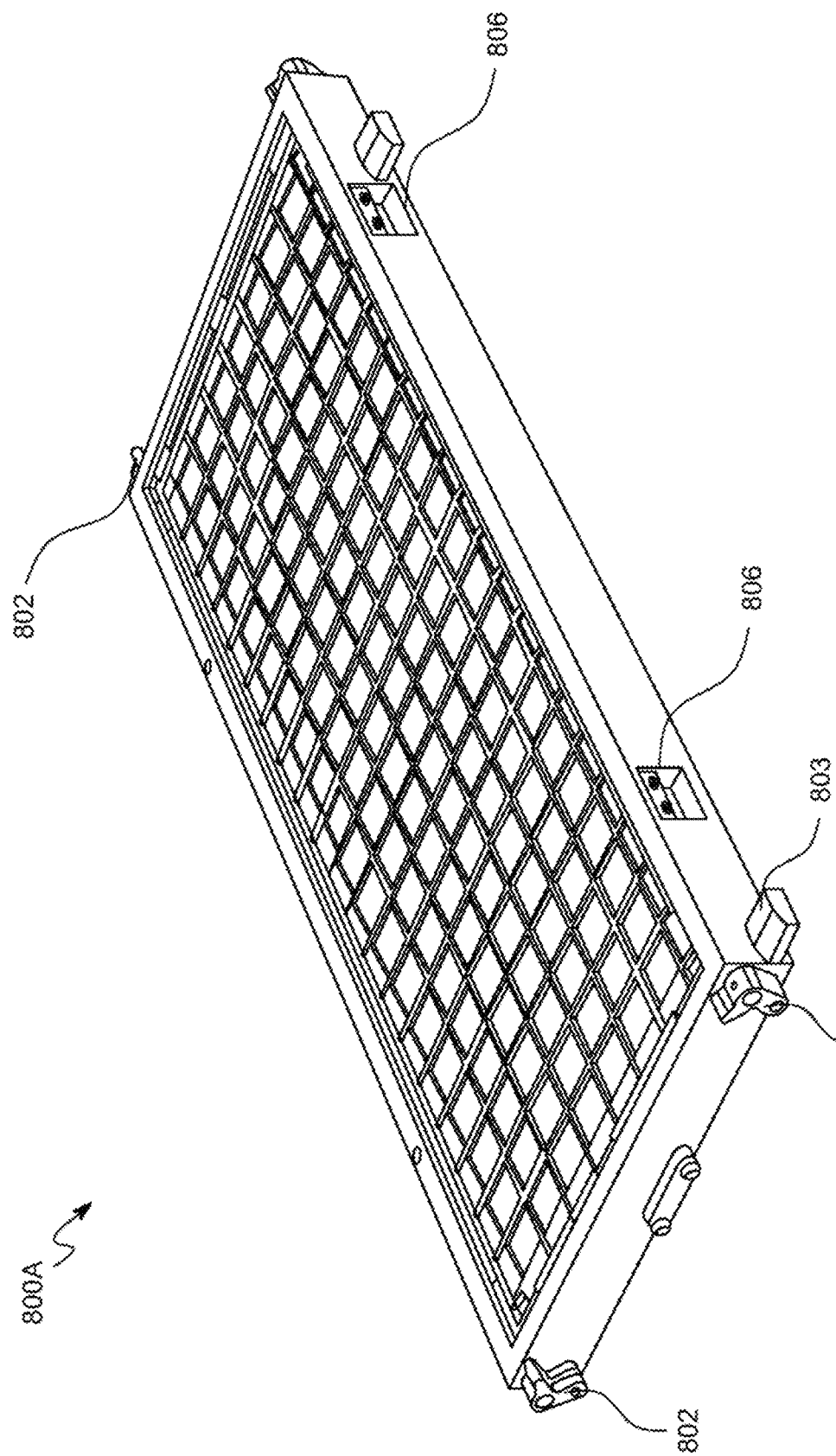
FIG. 8A shows an exemplary tray frame, according to an embodiment of the present disclosure.

A tray module (e.g. module 326 of FIG. 3B) can place individual trays into a tray frame to facilitate locating a single tray in the system without additional tray actuators or sensors. FIG. 8A demonstrates an exemplary tray frame 800A, and FIG. 8B demonstrates an exemplary tray separator 800B. An exemplary tray frame 800A can include latch actuators 802, locating features 803, and latches 806. Latches 806 can be actuated simultaneously, individually, one end, or one side at a time, according to different examples of the present disclosure. In some instances, latches 806 can be coupled together to enable different actuations. The identification tracker 804 can be used as an independent verification that a tray frame 800A was moved to a correct location in a rack assembly (for example, module 326). In some examples, the identification tracker 804 can be a series of holes, an RFID tag, a barcode, a 2D matrix code, magnet, or any other mechanism allowing the tray frame to be individually identified, as would be commonly used in the art.

In some embodiments, tray frames 800A can be used with JEDEC trays (e.g. trays 308*a*, 308*b*, 308*c*, 308*d*, 308*e*, and 308*f* of FIGS. 3A-3D) to improve the throughput of the handling system. An exemplary module can use tray frames 800A in certain embodiments for each individual tray in order to align the tray in the X, Y, Z, and theta directions, and flatten the tray to improve the Z pick and place height of the individual devices. Trays (e.g. trays 308*a*, 308*b*, 308*c*, 308*d*, 308*e*, and 308*f* of FIGS. 3A-3D) can be warped in the heating and cooling processes; this warping can affect the pick and place movements of the devices. The module can use the tray frames 800A to bend the tray back into an unwarped or otherwise "flat" position. Thus, by unwarping the trays with the tray frames 800A, devices may be more easily picked from and placed into trays.

Moreover, the tray frame 800A simplifies the positioning of the tray without requiring air driven or mechanical position assistance. The tray frame 800A also eliminates the need for sensors to detect the presence or absence of the tray. The tray frame 800A can be used to allow identically configured load and unload positions in the handler. The tray frame 800A will also add mass to the tray to improve stability during the trays movement to allow for handling lighter devices.

Figure 8B:
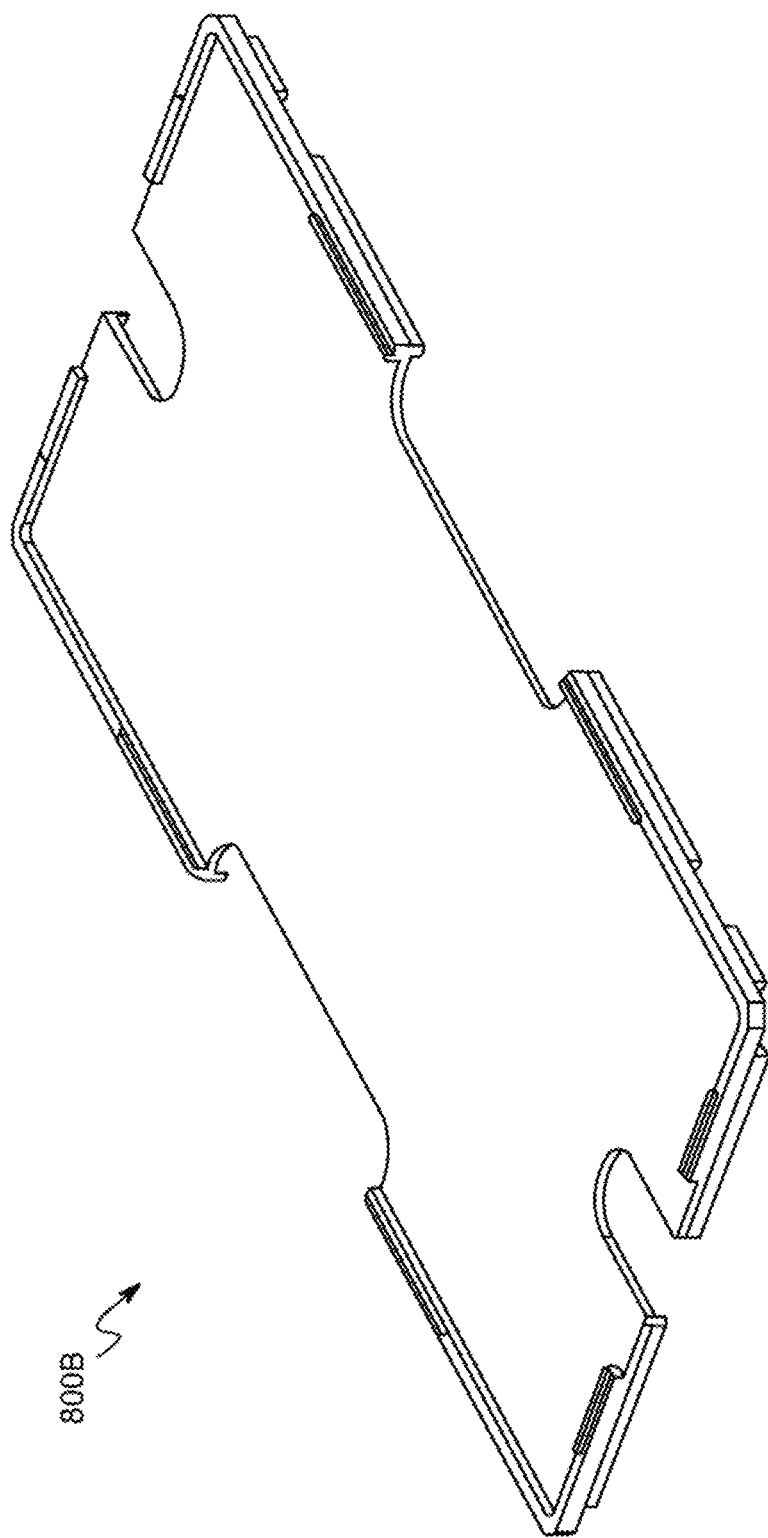
FIG. 8B shows an exemplary tray separator, according to an embodiment of the present disclosure.

In some embodiments, tray separators can be used. FIG. 8B shows an exemplary tray separator 800B, according to an embodiment of the present disclosure. Tray separators 800B can lay on top of a tray loaded into a tray frame 800A, and provide mechanical separation between devices and an adjacent tray frame when the tray frames are stacked on top of each other. Tray separators 800B can be used in tray modules (for example, tray module 326 of FIG. 3A) to separate untested devices from tested devices, and segregate the groups of tested devices from a unique bin category.

The tray separator 800B can be independently sensed in a tray module (for example, tray module 326 of FIG. 3A) to allow for faster and accurate movement of the stack of tray frames 800A and separators 800B. When separating individual groups of trays (e.g. trays being delivered to/from 308*a*, 308*b*, 308*c*, 308*d*, 308*e*, and 308*f* of FIGS. 3A-3D), the tray separator 800B ensures that a consistent mechanical plate is located and lifted from the stack below to ensure separation occurs between trays. The group of trays can then be unloaded from the system or a new tray can be placed by a tray robot onto the stack of trays.

Tray separators can therefore help automate the loading and unloading of trays into a handler system (e.g. system 300A, 300B, 300C, or 300D of FIGS. 3A-3D), and can allow for dynamic reassignment of tray placement positions between input and sort positions. Multiple trays at a time can also be assigned as input or sort positions. Tray separators 800B can keep the tested and untested devices separate. Tested devices can be separated by bin category when using tray separators 800B. These tray separators 800B can segregate and reduce the footprint of having a large stack of trays containing tested and untested devices. Vision or other machine readable identification can be used to track the movement of tray carriers and tray separators 800B.

In an alternate embodiment, a system might hold a stack of trays, and build or decrement the stack one tray at a time. Once a tray is filled, an empty tray could be placed on top of it. Alternatively, once a tray is emptied, it could be removed, exposing a new device tray to be emptied. This type of system, however, would not allow for the dynamic reassignment of input positions and bin categories. Another embodiment of the system might use manual tray positions that are loaded with a single tray, and need to be serviced more frequently. Other systems might use a combination of stacked trays and manual tray positions. These systems often use mechanical positioning actuators to register the top most trays to a reference position, and use sensors to sense the presence or absence of a tray. Any device misplacements tend to sway the stack of trays, and canter them as the stack is built. Furthermore, these systems hold significantly smaller stacks of trays at the input, and require servicing by an operator at an increased frequency.

Thermal ATC

Figure 9:
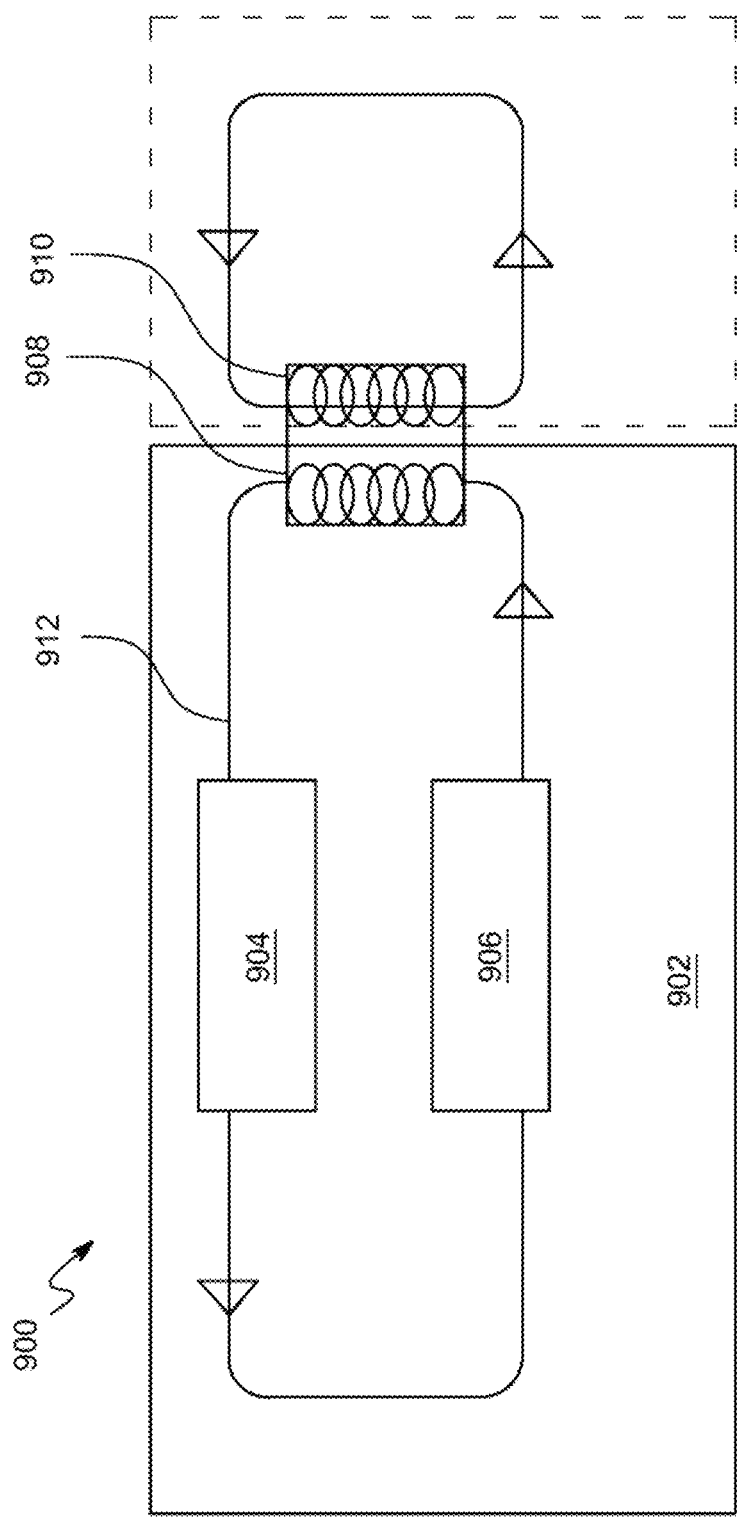
FIG. 9 shows an exemplary handler with a thermal fluid loop, according to an embodiment of the present disclosure.

It is also contemplated that, in some embodiments, an improved heating cooling system can be provided. FIG. 9 shows an exemplary diagram of an improved handler thermal fluid loop. An exemplary handler 900 can include a device handling portion 902, a test site 904, a soak plate 906, an internal heat exchanger 908, an external heat exchanger 910, and a thermal loop 912.

A fluid can be used to heat and cool the device during soak and test. Conventional systems have used a nonconductive circulating fluid to add or remove heat from the device. These fluids have had specific thermal restrictions based on the freezing and boiling point of the fluid. No single fluid could be used to accomplish active thermal control at both the cold and hot end of the spectrum. The same fluid must operate at −80° C. or colder and up to 200° C. in some embodiments.

In the various embodiments of the present disclosure, a pressurized gas or fluid can circulate in the handler 902 to both heat and cool devices. For such pressurized gases or fluids, the pressure can be selected so as to adjust their freezing and boiling points and therefore provide the range of temperature required for testing. Any single non-conductive or conductive fluid or gas could be used across the full temperature range of −80° C. or colder to 200° C. without incurring viscosity or boiling problems. However, a nonconductive fluid or gas has the advantage that it is less likely to damage devices in the event of a leak. Fluids which can be significantly colder during a cold test allow for a larger temperature difference from the actual test temperature. If the fluid or gas is colder than the desired test temperature, a pulsed heater can be used to warm the head to the exact test temperature. This allows for the device to dissipate more power during testing.

Other embodiments of the invention can use a Peltier Device or an inert fluid to heat or cool the device, while pulsing a heater to warm the head to the correct temperature. These systems have a restricted thermal performance. Additionally, some systems might use air as the heating and cooling method; these systems can be operated either with or without a heat sink attached to the device.

In certain embodiments of the present disclosure, the handler could use helium as its heat transfer medium. Helium does not have a high viscosity at cold temperatures nor does it boil at hot temperatures. This means that helium can work at and beyond the required temperatures for testing, unlike methoxy-nonafluorobutane (C4F9OCH2) and other fluids commonly used for heating devices in conventional testing systems. The helium could be pressurized in an enclosed thermal loop 912 within the handler 902 around the test site 904 and the soak plate 906. The helium can then be circulated and recirculated through the internal heat exchanger 908. The internal heat exchanger 908 can be connected to the external heat exchanger 910 which controls the temperature of the internal thermal loop 912. The external heat exchanger can be any of a refrigerated chiller, an LN2 chiller, a finned fan, a peltier device, or a thermal forcer.

Alternative Implementations

Integrated circuits (ICs) are sometimes tested for long periods of time in a lab or small lot production environment before, during, and after the time that they go into full volume production. Conventional testing had to occur by hand, through manually inserting one or more devices into a contactor, and using a thermal stream or similar device to bring the devices to temperature prior to and during the test of the device. A person had to manually make the product transfers. This can be very inefficient as tests can be lengthy, and tests cannot occur if a person is handling other tasks. Furthermore, devices are subject to damage due to the mechanical handling that is involved. Other conventional methods required a large automated test handler; this is a poor use of the system and highly inefficient because a large handler is designed for larger jobs. Additionally, labs often do not have access to full production test systems.

Figure 10A:
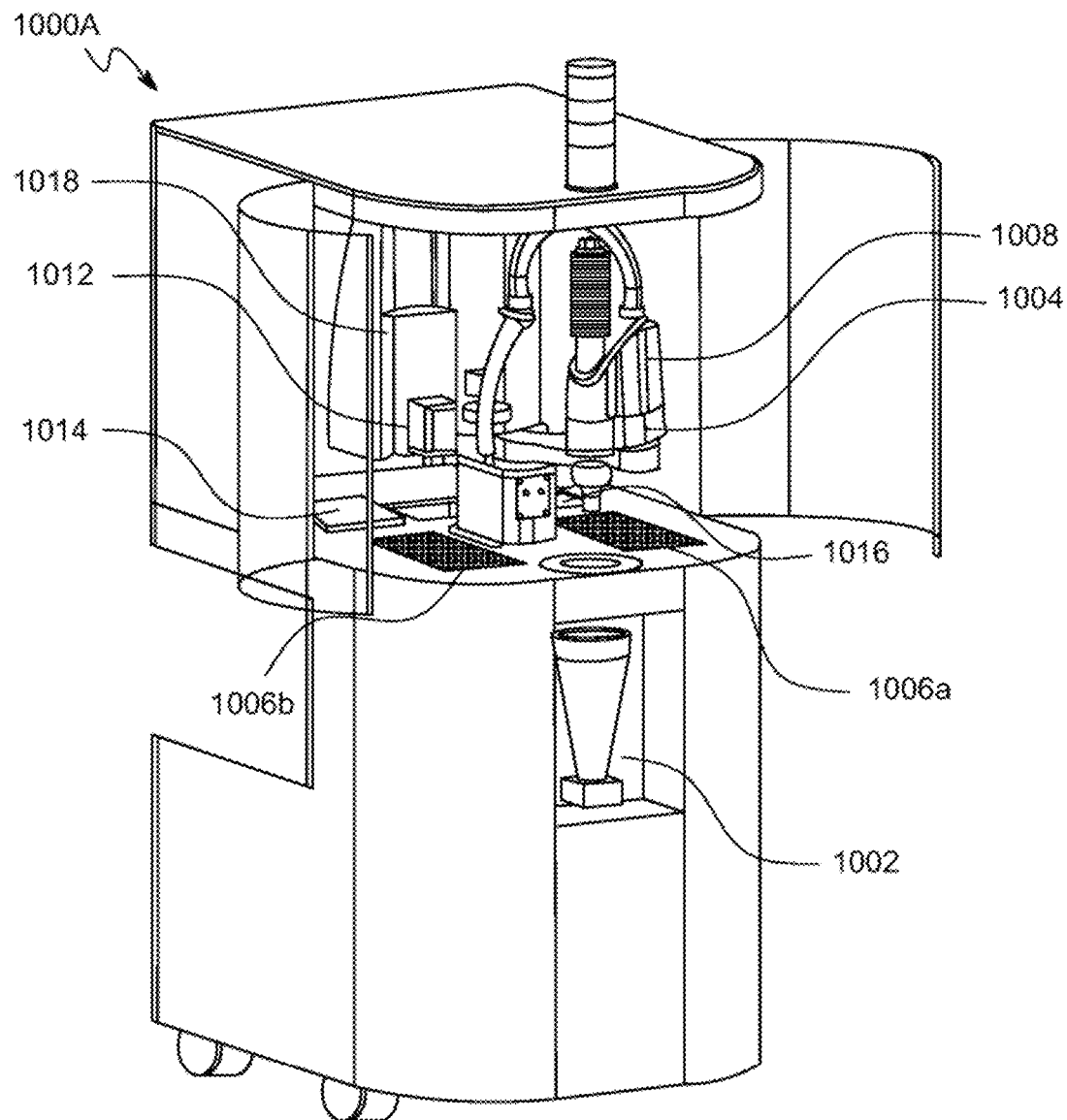
FIG. 10A shows an exemplary compact design of a kit-less pick and place handler, according to an embodiment of the present disclosure.
Figure 10B:
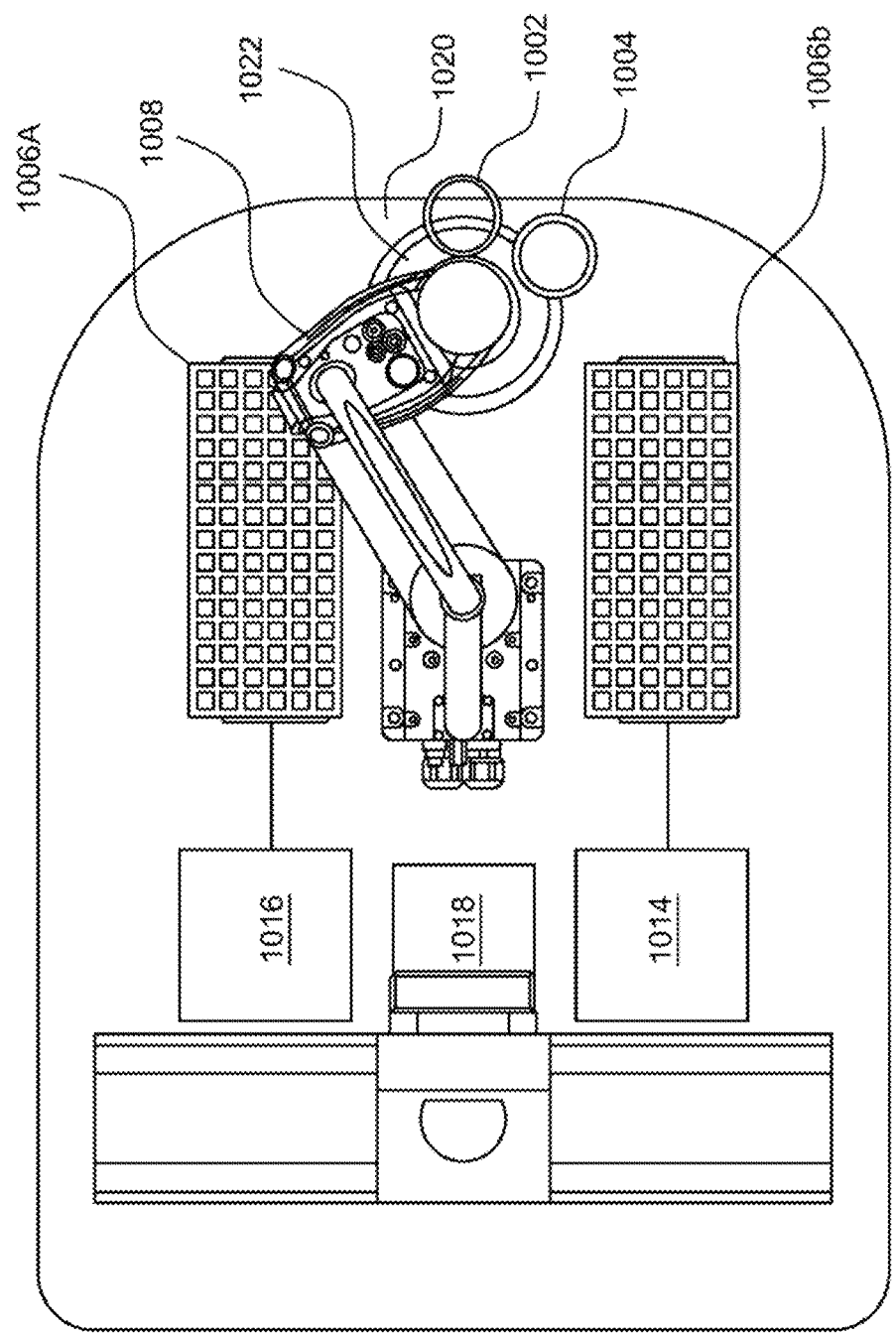
FIG. 10B shows an exemplary cut-away view of a compact kit-less pick and place handler, according to an embodiment of the present disclosure.

Therefore, FIGS. 10A-10B provide a compact handler 1000 that can automatically handle and test devices and can be placed in a lab or on a production test floor.

FIG. 10A is a perspective view showing a test handler 1000A, according to another exemplary embodiment of the present disclosure. Like the implementations of FIGS. 3A-4, the implementation of FIG. 10A also employs a vision alignment strategy that aligns the device, and can reduce the potential of device damage. Further, also like the handlers of FIGS. 3A-4, the handler of FIG. 10A also utilizes a kit-less device handling system that diminishes induced PNP positional errors, eliminates handling transfers, and reduces complexity/costs of the mechanisms involved, while allowing a high throughput.

Systems 1000A of FIG. 10A and 1000B of FIG. 10B can include an upward facing camera 1002, a prime mover camera 1004, trays 1006a and 1006b, a prime mover 1008, a contactor head 1012, a soak plate 1014, a de-soak plate 1016, a test site 1018, a fixed fiducial 1020, and an XYZ head 1022. Systems 1000A and 1000B can provide for loading a tray of untested devices at 1006a. An empty tray can be loaded at 1006b. An XYZ head 1022 on the prime mover 1008 can pick the devices from 1006a, and move them over the upward facing camera 1002 so that the devices are imaged at the upward facing camera 1002. Based on the imaging at the upward facing camera 1002, the devices can be placed on soak plate 1014. The devices can then be picked up by a contactor head 1012 and placed into a contactor. The contactor head 1012 can be a self-contained high force mechanism configured to provide the necessary force to ensure a solid connection between the device and the test contactor. Devices can then be removed from the contactor by contactor head 1012 and placed into a de-soak plate 1016. Devices can be removed from the de-soak plate 1016 and placed into tray 1006b. In some examples of FIGS. 10A-10B, the systems 1000A and 1000B can run backwards such that untested devices start at 1006b and move through the system towards 1006a. In other examples of FIGS. 10-A-10B devices can be placed back into the same tray that they were picked from.

Systems 1000A of FIG. 10A and 1000B of FIG. 10B can also provide for several cameras to image the devices during processing. For example, prime mover camera 1004 can be a downward looking camera that is attached to the prime mover 1008. Upward-facing camera 1002 can be an upward looking stationary camera to image devices before being placed into the soak plate 1014. Fixed fiducial 1020 can be a fixed fiducial that moves over the prime mover camera 1004, and is simultaneously imaged by both prime mover camera 1004 and upward-facing camera 1002 to define 0,0 in a world coordinate system in the handler. Upward-facing camera 1002 can also image other positions in the handler to define other mechanisms and fixed locations.

Therefore, a system, as provided for by FIGS. 10A-10B, can be easily relocated, has a small storage footprint, has a lower cost than conventional test handlers, and can use thermal airstreams for heating/cooling that are typically already available in IC fabrication and test facilities. Devices can be handled in existing JEDEC trays, and can be mechanically picked and placed to reduce device damage and eliminate operator error such that the system can run unattended. In some examples, the system can use existing load board docking and load boards, and can be further configured to handle multi-site testing.

In some examples of FIGS. 10A-10B, 90-degree device rotation can be accomplished by rotating the trays 90-degrees while being placed into 1006a or 1006b.

Thermal testing can be accomplished in several other ways, including (1) a thermal head, (2) a conventional head with a heater, or (3) a liquid cooling or heating head. The thermal head can allow for both vacuum and air impingement via a fan or pressurized air from the temperature forcer to pick up and control the temperature of the device. The liquid cooling or heating head as described in FIG. 9 can also be used to provide active or passive temperature testing. In some examples of FIGS. 10A-10B, device temperature with a resistance temperature detector (RTD) that is located in the conduction/convection hybrid head. Alternate forms of thermal feedback directly from the device may also be employed. As would be readily understood by a person skilled in the art, the thermal testing as described above can be used in any embodiment of the present disclosure in addition to the embodiment discussed with respect to FIGS. 10A-10B.

Like the implementation of FIGS. 3A-4, the implementation of FIGS. 10A-10B also reduces alignment needs by performing a good initial alignment using the kit-less soak plates and transferring the kit-less soak plates to the testing area. Thus, the only critical subsequent motion needed is the placement in the test site. As a result, device moves are minimized and throughput of the system can be increased. Additionally, the chance of device damage is reduced.

As noted above, the implementation of FIGS. 10A-10B, like that of FIGS. 3A-4, is but one possible implementation. Accordingly, other implementations in accordance with the various embodiments can have more or less features than shown in the implementations of FIGS. 3A-4 and FIGS. 10A-10B. Moreover, some implementations can have a mix of features from the implementations of FIGS. 3A-4 and FIGS. 10A-10B.

Improved Method of Vision Alignment

As noted above, the handler operates using a vision alignment strategy. Vision alignment, according to the various embodiments, requires a camera and proper lighting to capture the proper features on the devices and their locations relative to a known reference point. Balls, pads, leads, mechanical features, or fiducials on the device are usually used for this purpose. The positional error is calculated relative to an X, Y and theta reference position. These error values are added to or subtracted from the nominal or theoretical position when placing. However, the PnP heads only have an X axis and Y axis. To accomplish the theta error correction, the PnP tip could utilize a theta rotator actuator at the Z actuator position, or the Z rotation could be supplied by the pick head itself. An alternate method is to use the theta error, and add or subtract it from the turret rotation for that device's placement. An additional error must be added to the X axis and Y axis position to account for the theta error position. No additional mechanisms or sensors are required for this functionality.

This vision alignment would provide a method for aligning devices and/or inspecting them prior to the soak process and carrying that alignment accuracy through the test site. By aligning/inspecting the device much earlier in the handling process, and using kit-less hardware, multiple pick and place occurrences can be eliminated. Additionally, the vision alignment process is then outside of the critical motion path to the test site, and can avoid stringent timing requirements as in conventional systems.

By aligning/inspecting the device prior to thermal conditioning, the cameras are not subject to a hot/cold environment, and do not have to be used through a window. A single upward looking camera can be used for imaging the device before and after test. The device can then be realigned or re-inspected after test, if necessary, prior to placement back in the tray. A smaller number of cameras is required to accomplish the task of doing vision alignment and inspection.

By aligning or inspecting the device prior to test and controlling the location of the device all the way through test, no mechanical contactor alignment fixtures are required and the number of mechanical axis of motion is significantly reduced. As an example, if there are 2 x- and y-motion axis per contact site and there are 32 contact sites, 64 axis of motion would be required for testing 32 devices in parallel. If the x-motion axis and y-motion axis cannot generate a theta rotation, then an additional 32 axes would be required for a total of 96 axis of motion in order to test 32 devices in parallel.

In an alternate method, more than one upward and downward cameras can be used to accomplish vision alignment, and can be located just prior to inserting the device into the test site. This location would often require a mechanical alignment fixture at or near the contactor.

Example Computer System

FIG. 11 illustrates an exemplary system 1100 that includes a general-purpose computing device 1100, including a processing unit (CPU or processor) 1120 and a system bus 1110 that couples various system components including the system memory 1130, such as read only memory (ROM) 1140, and random access memory (RAM) 1150 to the processor 1120. The system 1100 can include a cache of high speed memory connected directly with, in close proximity to, or integrated as part of the processor 1120. The system 1100 copies data from the memory 1130 and/or the storage device 1160 to the cache for quick access by the processor 1120. In this way, the cache provides a performance boost that avoids processor 1120 delays while waiting for data. These and other modules can control or be configured to control the processor 1120 to perform various actions. Other system memory 1130 may be available for use as well. The memory 1130 can include multiple different types of memory with different performance characteristics. It can be appreciated that the disclosure may operate on a computing device 1100 with more than one processor 1120 or on a group or cluster of computing devices networked together to provide greater processing capability. The processor 1120 can include any general purpose processor and a hardware module or software module, such as module 1 1162, module 2 1164, and module 3 1166 stored in storage device 1160, configured to control the processor 1120 as well as a special-purpose processor where software instructions are incorporated into the actual processor design. The processor 1120 may essentially be a completely self-contained computing system, containing multiple cores or processors, a bus, memory controller, cache, etc. A multi-core processor may be symmetric or asymmetric.

The system bus 1110 may be any of several types of bus structures including a memory bus or memory controller, a peripheral bus, and a local bus using any of a variety of bus architectures. A basic input/output (BIOS) stored in ROM 1140 or the like, may provide the basic routine that helps to transfer information between elements within the computing device 1100, such as during start-up. The computing device 1100 further includes storage devices 1160 such as a hard disk drive, a magnetic disk drive, an optical disk drive, tape drive or the like. The storage device 1160 can include software modules MOD1 1162, MOD2 1164, MOD3 1166 for controlling the processor 1120. Other hardware or software modules are contemplated. The storage device 1160 is connected to the system bus 1110 by a drive interface. The drives and the associated computer-readable storage media provide nonvolatile storage of computer readable instructions, data structures, program modules and other data for the computing device 1100. In one aspect, a hardware module that performs a particular function includes the software component stored in a non-transitory computer-readable medium in connection with the necessary hardware components, such as the processor 1120, bus 1110, output device 1170, and so forth, to carry out the function. The basic components are known to those of skill in the art and appropriate variations are contemplated depending on the type of device, such as whether the device 1100 is a small, handheld computing device, a desktop computer, or a computer server.

Although the exemplary embodiment described herein employs a hard disk as storage device 1160, it should be appreciated by those skilled in the art that other types of computer-readable media which can store data that are accessible by a computer, such as magnetic cassettes, flash memory cards, digital versatile disks, cartridges, random access memories (RAMs) 1150, read only memory (ROM) 1140, a cable or wireless signal containing a bit stream and the like, may also be used in the exemplary operating environment. Non-transitory computer-readable storage media expressly exclude media such as energy, carrier signals, electromagnetic waves, and signals per se. However, non-transitory computer-readable storage media do include computer-readable storage media that store data only for short periods of time and/or only in the presence of power (e.g., register memory, processor cache, and Random Access Memory (RAM) devices).

To enable user interaction with the computing device 1100, an input device 1190 represents any number of input mechanisms, such as a microphone for speech, a touch-sensitive screen for gesture or graphical input, keyboard, mouse, motion input, speech and so forth. An output device 1170 can also be one or more of a number of output mechanisms known to those of skill in the art. In some instances, multimodal systems enable a user to provide multiple types of input to communicate with the computing device 1100. The communications interface 1180 generally governs and manages the user input and system output. There is no restriction on operating on any particular hardware arrangement and therefore the basic features here may easily be substituted for improved hardware or firmware arrangements as they are developed.

For clarity of explanation, the illustrative system embodiment is presented as including individual functional blocks including functional blocks labeled as a "processor" or processor 1120. The functions these blocks represent may be provided through the use of either shared or dedicated hardware, including, but not limited to, hardware capable of executing software and hardware, such as a processor 1120, that is purpose-built to operate as an equivalent to software executing on a general purpose processor. For example, the functions of one or more processors presented in FIG. 11 may be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) 1140 for storing software performing the operations discussed below, and random access memory (RAM) 1150 for storing results. Very large scale integration (VLSI) hardware embodiments, as well as custom VLSI circuitry in combination with a general purpose DSP circuit, may also be provided.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system 1100 shown in FIG. 11 can practice all or part of the recited methods, can be a part of the recited systems, and/or can operate according to instructions in the recited non-transitory computer-readable storage media. Such logical operations can be implemented as modules configured to control the processor 1120 to perform particular functions according to the programming of the module. For example, FIG. 11 illustrates three modules MOD1 1162, MOD2 1164 and MOD3 1166, which are modules configured to control the processor 1120. These modules may be stored on the storage device 1160 and loaded into RAM 1150 or memory 1130 at runtime or may be stored as would be known in the art in other computer-readable memory locations.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A test handler system for conducting thermal testing of a device, comprising:
   a thermal soak plate positioned to receive the device and maintain an accurate position of the device;
   a thermal de-soak positioned to receive the device and maintain an accurate position of the device;
   a test site;
   a first prime mover for removing the device from a tray to place the device directly in contact with the thermal soak plate and for removing the device from the thermal de-soak plate to place the device back in the tray; and
   a second prime mover for removing the device from the thermal soak plate, moving the device to the test site, and moving the device from the test site to be directly in contact with the thermal de-soak plate.

2. The test handler system of claim 1, wherein the first prime mover comprises a gantry and an XYZ head.

3. The test handler of claim 2, wherein the XYZ head further comprises one or more pick and place heads, wherein each of the pick and place heads comprises a pick and place tip under a constant or intermittent vacuum for picking up the device, and a removing element for separating the vacuum tip from the device.

4. The test handler of claim 2, wherein the XYZ head is configured to rotate the device prior to and after testing in a unitary pick and place motion, wherein the XYZ head makes a theta correction to the device both prior to and after testing.

5. The test handler of claim 4, wherein the theta correction occurs before the pick and place motion.

6. The test handler of claim 4, wherein the theta correction occurs during the pick and place motion.

7. The test handler of claim 4, wherein the theta correction occurs after the pick and place motion.

8. The test handler system of claim 2, wherein the gantry and XYZ head are configured to transfer the device between the thermal soak plate and the tray.

9. The test handler system of claim 8, further comprising a tray frame to hold the tray, wherein the tray frame biases the tray to an unwarped configuration.

10. The test handler system of claim 1, wherein the thermal soak plate uses helium as a heat transfer medium to heat and cool the device.

11. The test handler system of claim 1, wherein the thermal soak plate uses pressurized gas or liquid as a heat transfer medium to heat and cool the device.

12. The test handler system of claim 1, wherein the device is an integrated circuit.

13. The test handler system of claim 1, wherein the thermal soak plate comprises a surface for maintaining the position of the device without mechanical structures.

14. The test handler system of claim 1, wherein the thermal soak plate comprises a tacky surface for maintaining the accurate position of the device based on a friction between the device and the thermal soak plate.

15. The test handler system of claim 1, wherein the test handler system is further configured to visually verify the location of the device through the use of a camera prior to the placement of the device onto the thermal soak plate.

16. The test handler system of claim 1, further comprising a plurality of tray separators, with each tray separator associated with a bin category,
wherein the test handler system is configured to separate the device according to its corresponding bin category and transport the tray into a corresponding one of the plurality of tray separators.

17. The test handler system of claim 16, wherein the plurality of tray separators separates a plurality of trays, wherein separating occurs based on whether each tray holds tested devices, untested devices, or no devices.

18. The test handler system of claim 1, wherein the test handler system is configured to conduct thermal testing of a plurality of the device.

\* \* \* \* \*

UNITED STATES PATENT AND TRADEMARK OFFICE
CERTIFICATE OF CORRECTION

| | |
|---|---|
| PATENT NO. | : 11,474,147 B2 |
| APPLICATION NO. | : 16/955583 |
| DATED | : October 18, 2022 |
| INVENTOR(S) | : Stuckey et al. |

Page 1 of 1

It is certified that error appears in the above-identified patent and that said Letters Patent is hereby corrected as shown below:

In the Claims

At Column 20, Line 58 (Claim 3, Line 1), please delete "the test handler of claim 2" and insert --the test handler system of claim 2-- therefor.

At Column 20, Line 64 (Claim 4, Line 1), please delete "the test handler of claim 2" and insert --the test handler system of claim 2-- therefor.

At Column 21, Line 1 (Claim 5, Line 1), please delete "the test handler of claim 4" and insert --the test handler system of claim 4-- therefor.

At Column 21, Line 3 (Claim 6, Line 1), please delete "the test handler of claim 4" and insert --the test handler system of claim 4-- therefor.

At Column 21, Line 5 (Claim 7, Line 1), please delete "the test handler of claim 4" and insert --the test handler system of claim 4-- therefor.

At Column 21, Lines 22-23 (Claim 13, Lines 2-3), please delete "maintaining the position" and insert --maintaining the accurate position-- therefor.

Signed and Sealed this
Twenty-fifth Day of March, 2025

Coke Morgan Stewart
*Acting Director of the United States Patent and Trademark Office*